(12) United States Patent
Chen et al.

(10) Patent No.: US 10,534,047 B2
(45) Date of Patent: Jan. 14, 2020

(54) TUNNEL MAGNETO-RESISTIVE (TMR) SENSORS EMPLOYING TMR DEVICES WITH DIFFERENT MAGNETIC FIELD SENSITIVITIES FOR INCREASED DETECTION SENSITIVITY

(71) Applicant: QUALCOMM Incorporated, San Diego, CA (US)

(72) Inventors: Wei-Chuan Chen, San Diego, CA (US); Wah Nam Hsu, San Diego, CA (US); Xia Li, San Diego, CA (US); Seung Hyuk Kang, San Diego, CA (US); Nicholas Ka Ming Stevens-Yu, Palo Alto, CA (US)

(73) Assignee: QUALCOMM Incorporated, San Diego, CA (US)

(*) Notice: Subject to any disclaimer, the term of this patent is extended or adjusted under 35 U.S.C. 154(b) by 222 days.

(21) Appl. No.: 15/474,339

(22) Filed: Mar. 30, 2017

(65) Prior Publication Data
US 2018/0284200 A1  Oct. 4, 2018

(51) Int. Cl.
*G01R 33/09* (2006.01)
*H01L 43/08* (2006.01)
(Continued)

(52) U.S. Cl.
CPC ....... *G01R 33/098* (2013.01); *G01R 33/1269* (2013.01); *G01R 33/1276* (2013.01); *H01L 27/22* (2013.01); *H01L 43/08* (2013.01)

(58) Field of Classification Search
CPC .............. G01R 33/098; G01R 33/1269; G01R 33/1276; H01L 27/22; H01L 43/08
See application file for complete search history.

(56) References Cited

U.S. PATENT DOCUMENTS 7,619,431 B2   11/2009   De Wilde et al.
8,513,029 B2   8/2013   Zhou
(Continued)

OTHER PUBLICATIONS

International Search Report and Written Opinion for PCT/US2018/025141, dated Jul. 30, 2018, 27 pages.
(Continued)

*Primary Examiner* — Jermele M Hollington
*Assistant Examiner* — Feba Pothen
(74) *Attorney, Agent, or Firm* — W&T/Qualcomm

(57) ABSTRACT

Tunnel magneto-resistive (TMR) sensors employing TMR devices with different magnetic field sensitivities for increased detection sensitivity are disclosed. For example, a TMR sensor may be used as a biosensor to detect the presence of biological materials. In aspects disclosed herein, free layers of at least two TMR devices in a TMR sensor are fabricated to exhibit different magnetic properties from each other (e.g., MR ratio, magnetic anisotropy, coercivity) so that each TMR device will exhibit a different change in resistance to a given magnetic stray field for increased magnetic field detection sensitivity. For example, the TMR devices may be fabricated to exhibit different magnetic properties such that one TMR device exhibits a greater change in resistance in the presence of a smaller magnetic stray field, and another TMR device exhibits a greater change in resistance in the presence of a larger magnetic stray field.

30 Claims, 13 Drawing Sheets

(51) Int. Cl.
*H01L 27/22* (2006.01)
*G01R 33/12* (2006.01)

(56) References Cited

U.S. PATENT DOCUMENTS

| | | |
|---|---|---|
| 9,069,033 B2 | 6/2015 | Chen et al. |
| 2002/0060565 A1 | 5/2002 | Tondra |
| 2007/0064351 A1* | 3/2007 | Wang .................... B82Y 25/00 |
| | | 360/324.2 |
| 2009/0186770 A1 | 7/2009 | Shi et al. |
| 2009/0224755 A1 | 9/2009 | Kahlman et al. |
| 2010/0213934 A1 | 8/2010 | Wang et al. |
| 2014/0292318 A1 | 10/2014 | Wang et al. |
| 2016/0303392 A1* | 10/2016 | Wang .................... A61N 2/006 |
| 2016/0313413 A1 | 10/2016 | Mohan et al. |

OTHER PUBLICATIONS

Wang, Shan X. et al., "Advances in Giant Magnetoresistance Biosensors With Magnetic Nanoparticle Tags: Review and Outlook," IEEE Transactions on Magnetics, vol. 44, No. 7, Jul. 2008, pp. 1687-1702.

International Preliminary Report on Patentability for PCT/US2018/025141, dated Oct. 10, 2019, 21 pages.

* cited by examiner

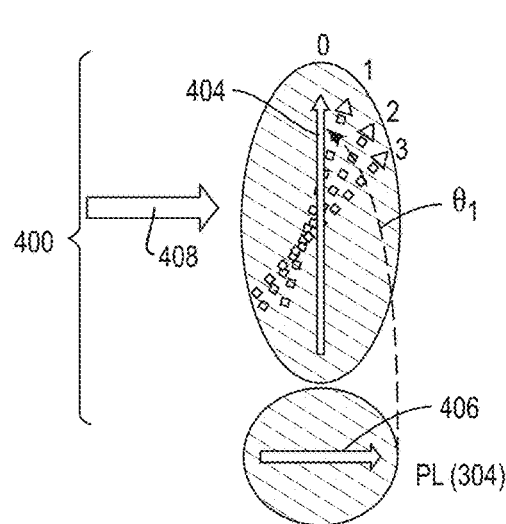
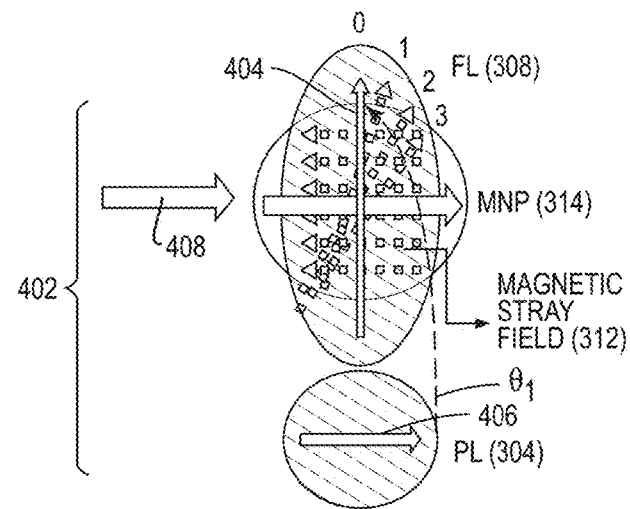
*FIG. 4A*  *FIG. 4B*
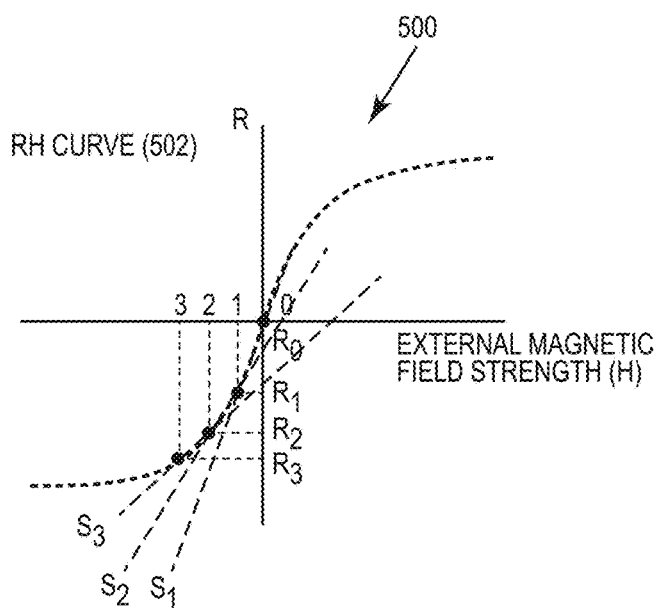
*FIG. 5*

TUNNEL MAGNETO-RESISTIVE (TMR) SENSORS EMPLOYING TMR DEVICES WITH DIFFERENT MAGNETIC FIELD SENSITIVITIES FOR INCREASED DETECTION SENSITIVITY

BACKGROUND

I. Field of the Disclosure

The technology of the disclosure relates generally to magneto-resistive (MR) devices, and more particularly to use of MR devices as MR sensors, such as biosensors, for detecting a presence of magnetic fields, such as magnetic fields exhibited by magnetic nanoparticles.

II. Background

It may be desired in health care and other related fields to be able to detect the presence of a target analyte in a biological sample for diagnosing, monitoring, and/or maintaining health and wellness. Detecting target analytes may also be desired for performing certain health care related applications, such as human genotyping, bacteriological screening, and biological and pharmacological research. In this regard, biosensing systems can be employed to detect the presence of a target analyte in a biological sample for such applications. Biosensors are employed in biosensing systems to detect the presence of target analytes. A biosensor consists of two (2) components: a bioreceptor and a transducer. A bioreceptor is a biomolecule that recognizes a target analyte. The transducer converts the recognition event of the target analyte into a measurable signal based on a change that occurs from the bioreceptor in reaction to the presence of the target analyte. For example, a biosensor could be provided that measures glucose concentration in a blood sample by simply dipping the biosensor in the sample. This is in contrast to a conventional assay in which many steps are used and wherein each step may require a reagent to treat the sample. The simplicity and the speed of measurement is a main advantage of a biosensor. Biosensors can be provided in many different forms including non-invasive, in vitro, transcutaneous, ingested (e.g., a pill), and as a wearable or surgically implanted device.

FIG. 1 illustrates an exemplary biosensing system 100 that employs a biosensor for detecting a presence and/or properties of a biological sample. A biological sample 102 to be tested is obtained or prepared. The biological sample 102 is a sensitive biological element (e.g., tissue, microorganisms, organelles, cell receptors, enzymes, antibodies, nucleic acids, etc.) and is a biologically derived material or biomimetic component that interacts (binds or recognizes) with the target analyte under study. Examples of biological samples include cell cultures, human samples, food samples, and environmental samples. The biological sample 102 is then processed to separate a target analyte 104 of interest (e.g., a certain molecule, nucleotide, protection, or metal ion). The target analyte 104 is then introduced to target bioreceptors 106 that are designed to interact with the specific target analyte 104 of interest to produce an effect measurable by a transducer. Unbound analytes are washed away.

One type of biosensor that has been developed to detect a target analyte of interest is a magneto-resistive (MR) biosensor. MR biosensors include a transducer that is configured to recognize a magnetic field change as a function of a sensed resistance. In this regard, as shown in FIG. 1, high magnetization magnetic or superparamagnetic nanoparticles 108 (hereinafter "magnetic nanoparticles 108") can be introduced and captured by the target bioreceptors 106 that are bound to the target analyte 104. The magnetic nanoparticles 108 can then be introduced to an MR biosensor 110 to detect the presence of the magnetic nanoparticles 108. The MR biosensor 110 measures the magnetic field change as a result of introduction of the magnetic nanoparticles 108 as a function of a change in resistance. The MR biosensor 110 generates a signal 112 representing this change in resistance that can be analyzed by a sensing circuit 114 to determine the presence of the target analyte 104 in the target bioreceptors 106.

One type of MR sensing technology that can be employed in biosensing applications is a giant magneto-resistive (GMR) biosensor, such as a GMR sensor 200 shown in FIG. 2. The GMR sensor 200 can be fabricated using standard very-large-scale integration (VLSI) fabrication technology. The GMR effect of the GMR sensor 200 originates from its spin-dependent scattering, which depends on a relative spin of a carrier and scattering site. In this regard, the GMR sensor 200 includes a GMR device 202 that includes a pinned layer 204 that has a fixed magnetization, a non-magnetic metal spacer 206, and a free layer 208 that has a free magnetization. The pinned layer 204 is formed on a substrate 210 and is comprised of a metal material (e.g., a Cobalt (Co) material) that has a fixed horizontal magnetization in the X direction (i.e., magnetic moments aligned in the X direction), which is in-plane to the GMR device 202. The metal spacer 206, such as a Copper (Cu) spacer, is disposed above the pinned layer 204. The free layer 208 is disposed above the metal spacer 206. The free layer 208 has a magnetization that can rotate freely based on a change in a magnetic stray field 212 applied to the free layer 208. The magnetic stray field 212 is provided by the magnetization of magnetic nanoparticles 214 passing in an external channel 216 (e.g., a microfluidic channel) in the GMR sensor 200, thereby forming a biological active area that is captured by bioreceptors bound to a target analyte to be detected. The external channel 216 may be formed in a passivation layer 218 of a biochip 220 above a metal cap layer 222 such that the external channel 216 is externally accessible from the internal components of the biochip 220 that forms a microfluidic device. For example, the magnetic nanoparticles 214 may be in a fluid form that is disposed in the external channel 216. An external magnetic field 224, such as from an external coil, is applied longitudinal or perpendicular to the external channel 216 to align and saturate the magnetic moments of the magnetic nanoparticles 214. Thus, when the magnetic nanoparticles 214 pass in the external channel 216 above the free layer 208 of a first polarity, the magnetic stray field 212 of the magnetic nanoparticles 214 induces a change in the magnetic moment in the free layer 208. This change in the magnetic moment of the free layer 208 causes a change in resistance of the GMR device 202. This change in resistance resulting from disturbing the magnetic moment of the free layer 208 can be determined based on sensing a voltage change in the GMR device 202. For example, a sense current $Is_1$ can be directed to flow through the metal spacer 206 and the free layer 208, and between metal lines 226(1), 226(2) to measure the voltage across the metal lines 226(1), 226(2) based on the resistance of the GMR device 202 according to Ohm's law.

While the GMR device 202 in FIG. 2 can be used as a biosensor, several issues exist. The GMR device 202 may be difficult to scale down due to its current-in-plane (CIP) design. In the CIP design, the metal lines 226(1), 226(2) are disposed at the top of the GMR sensor 200. The metal lines 226(1), 226(2) may have a minimum pitch due to fabrication limitations that cannot be scaled down. Further, the external magnetic field 224 is also required beyond the biochip 220. Further, an MR ratio of the GMR device 202 may be low, such as less than 25%, thereby providing a lower signal-to-noise ratio (SNR) of resistance change between the presence and lack of presence of the magnetic nanoparticles 214 resulting in a lower sensitivity device. A strong magnetic stray field 212 in the magnetic nanoparticles 214 and/or the presence of more magnetic nanoparticles 214 could improve the SNR of the GMR device 202. However, the external channel 216 is separated from the free layer 208 by the passivation layer 218 and the metal cap layer 222. Further, the working temperature of the GMR device 202 may be lower, because the metal spacer 206 may otherwise diffuse into the pinned and free layers 204, 208, thereby changing the MR properties of the GMR device 202.

SUMMARY OF THE DISCLOSURE

Aspects of the present disclosure involve tunnel magneto-resistive (TMR) sensors employing TMR devices with different magnetic field sensitivities for increased detection sensitivity. For example, a TMR sensor may be used as a biosensor to detect the presence of biological materials. The TMR sensor may be fabricated as a biosensor chip using semiconductor fabrication methods. The TMR sensor includes TMR devices that each include a magnetic tunnel junction (MTJ) comprised of a pinned ferromagnetic layer having a fixed magnetization (i.e., magnetic moment) and a free layer having a free magnetization that can rotate in the presence of a magnetic stray field, separated by a tunnel barrier. The change in resistance of a TMR device is a function of the change in the magnetization angle between its free layer and pinned layer. An external channel formed in the TMR sensor provides a biological active area to allow magnetic nanoparticles captured by bioreceptors bound to target analytes of interest to pass and be detected. A magnetic field can be applied to the magnetic nanoparticles to align their magnetic moments for generating a magnetic stray field in the free layers in the TMR devices as the magnetic nanoparticles pass in the external channel. As a result, the magnetic moments of the free layers are changed thus changing the magnetization angle between the free layers and their pinned layers, which changes the resistances of the TMR devices. A sensing circuit can be included in the TMR sensor to sense the changes in resistance in the TMR devices as a way to detect the presence and measure the magnetic nanoparticles passing through the external channel of the TMR sensor. The detection sensitivity of a TMR sensor is dependent on the minimum change in resistance that can be sensed by the sensing circuit included in the TMR sensor.

A greater change in resistance occurs in the TMR devices in the presence of a magnetic stray field when the fabrication of the TMR devices sets the magnetization angle between the free layer and the pinned layer larger towards orthogonal. As the magnetization angle between the free layer and the pinned layer is changed from orthogonal, less change in resistance occurs in a TMR device in the presence of a magnetic stray field. When a magnetic bias field is applied to the TMR sensor to align the magnetic moments of magnetic nanoparticles passing through the external channel, this magnetic field is also applied to the free layers of the TMR devices in the TMR sensor. This can cause the magnetic moments of the free layers to rotate and reduce the magnetization angle between their respective free layers and pinned layers in the TMR devices. Reducing the magnetization angle between a free layer and a pinned layer in a TMR device can reduce the detection sensitivity of the TMR sensor to a point where the change in resistance resulting from a magnetic stray field generated by the magnetic nanoparticles cannot be detected by the sensing circuit. This is because a smaller resistance change may occur in the presence of the magnetic stray field when the magnetization angle between the free layer and the pinned layer of a TMR device is reduced. Also, process variations can alter the magnetic properties of the TMR devices, during fabrication, such as MR ratio, magnetic anisotropy, and/or coercivity, and thus alter and potentially reduce the magnetization angle between their respective free layers and pinned layers in the TMR devices, thereby reducing the detection sensitivity of the TMR sensor. Also, the coercivity of the free layer can increase as the environmental temperature of the TMR sensor is reduced, thereby reducing the detection sensitivity of the TMR sensor.

Thus, in aspects disclosed herein, the free layers of at least two TMR devices in a TMR sensor are fabricated to exhibit different magnetic properties from each other (e.g., MR ratio, magnetic anisotropy, coercivity) so that each TMR device will exhibit a different change in resistance to a given magnetic stray field for increased magnetic field detection sensitivity. For example, the TMR devices may be fabricated to exhibit different magnetic properties such that one TMR device exhibits a greater change in resistance in the presence of a smaller magnetic stray field, and another TMR device exhibits a greater change in resistance in the presence of a larger magnetic stray field. As one example of providing TMR devices having different magnetic properties, TMR devices can be fabricated to having different magnetization angles between their free layers and the pinned layers at fabrication. For example, one TMR device in a TMR sensor may be fabricated to be more sensitive to smaller magnetic stray fields by increasing the magnetization angle between its free layer and pinned layer beyond orthogonal at fabrication. This can compensate for factors that may otherwise cause the magnetization angle between the free layer and pinned layer to be reduced, including rotation of the magnetic moment of the free layer due to application of a magnetic bias field to align the magnetization moments of the magnetic nanoparticles and/or change in magnetic properties due to process variations. Another TMR device may be fabricated to decrease the magnetization angle between its free layer and pinned layer lower than orthogonal to be more sensitive to larger magnetic stray fields. In another example, different TMR devices in a TMR sensor may be fabricated with free layers having different aspect ratios to compensate for variations in magnetic anisotropy and coercivity due to changes in environmental temperature for example. A smaller aspect ratio of the free layer provides greater magnetic field sensitivity for the TMR device.

In this regard, in one exemplary aspect, a TMR sensor is provided. The TMR sensor comprises a first TMR device comprising a first pinned layer, a first free layer, and a first tunnel barrier disposed between the first pinned layer and the first free layer. The first TMR device has a first magnetic sensitivity and a first resistance as a function of the first magnetic sensitivity. The TMR sensor also comprises a second TMR device comprising a second pinned layer, a second free layer, and a second tunnel barrier disposed between the second pinned layer and the second free layer. The second TMR device has a second magnetic sensitivity different from the first magnetic sensitivity of the first TMR device, and has a second resistance as a function of the second magnetic sensitivity.

In another exemplary aspect, a TMR sensor is provided. The TMR sensor comprises a first means disposed in an encapsulation material and having a first magnetic sensitivity for providing a first resistance as a function of the first magnetic sensitivity, and for exhibiting a first change rate in the first resistance in response to a magnetic stray field as a function of the first magnetic sensitivity. The TMR sensor also comprises a second means disposed in the encapsulation material and having a second magnetic sensitivity for providing a second resistance as a function of the second magnetic sensitivity, and for exhibiting a second change rate in the second resistance in response to the magnetic stray field as a function of the second magnetic sensitivity. The TMR sensor also comprises a means formed in a void in the encapsulation material for capturing external magnetic nanoparticles exerting the magnetic stray field on the first means and the second means.

In another exemplary aspect, a TMR sensing system is provided. The TMR sensing system comprises one or more TMR sensors. Each of the one or more TMR sensors comprises a first TMR device disposed in an encapsulation material. The first TMR device comprises a first pinned layer, a first free layer, and a first tunnel barrier disposed between the first pinned layer and the first free layer, wherein the first TMR device has a first magnetic sensitivity and a first resistance as a function of the first magnetic sensitivity. Each of the one or more TMR sensors also comprises a second TMR device disposed in the encapsulation material. The second TMR device comprises a second pinned layer, a second free layer, and a second tunnel barrier disposed between the second pinned layer and the second free layer, wherein the second TMR device has a second magnetic sensitivity different from the first magnetic sensitivity of the first TMR device, and has a second resistance as a function of the second magnetic sensitivity. The TMR sensing system also comprises a sensing circuit. The sensing circuit is configured to select a TMR sensor among the one or more TMR sensors in response to a sense operation, generate a first sensed voltage based on a change in the first resistance of the first TMR device of the selected TMR sensor, and generate a second sensed voltage based on a change in the second resistance of the second TMR device of the selected TMR sensor.

In another exemplary aspect, a method of detecting a presence of magnetic nanoparticles in TMR sensor is provided. The method comprises receiving magnetic nanoparticles bound to a bioreceptor configured to capture a target analyte in a biosensor chip in at least one external channel among a plurality of external channels each forming a biological active area. The biosensor chip comprises a plurality of TMR sensors each comprising a first TMR device disposed in an encapsulation material. The first TMR device comprises a first pinned layer, a first free layer, and a first tunnel barrier disposed between the first pinned layer and the first free layer, wherein the first TMR device has a first magnetic sensitivity and a first resistance as a function of the first magnetic sensitivity. The plurality of TMR sensors also each comprise a second TMR device disposed in the encapsulation material, the second TMR device comprising a second pinned layer, a second free layer, and a second tunnel barrier disposed between the second pinned layer and the second free layer, wherein the second TMR device has a second magnetic sensitivity different from the first magnetic sensitivity of the first TMR device, and has a second resistance as a function of the second magnetic sensitivity. The method also comprises selecting at least one TMR sensor among the plurality of TMR sensors in response to a sense operation. The method also comprises generating a first sensed voltage based on a change in the first resistance of the first TMR device of the selected at least one TMR sensor. The method also comprises generating a second sensed voltage based on a change in the second resistance of the second TMR device of the selected at least one TMR sensor.

BRIEF DESCRIPTION OF THE FIGURES

FIGS. 4A and 4B are diagrams illustrating exemplary magnetization angles between a free layer and a pinned layer in the TMR device in FIG. 3 when an external magnetic stray field is not present from magnetic nanoparticles, and when a magnetic stray field is generated in the presence of magnetic nanoparticles, respectively;

FIG. 5 is a graph illustrating resistances of the TMR device in FIG. 3 as a function of the magnetic field strength of a magnetic field applied to the free layer of the TMR device in FIG. 3 and specifically illustrating the resistance of the TMR device at the magnetization angle orientations between the free layer and the pinned layer shown in FIGS. 4A and 4B;

DETAILED DESCRIPTION

Figure 1:
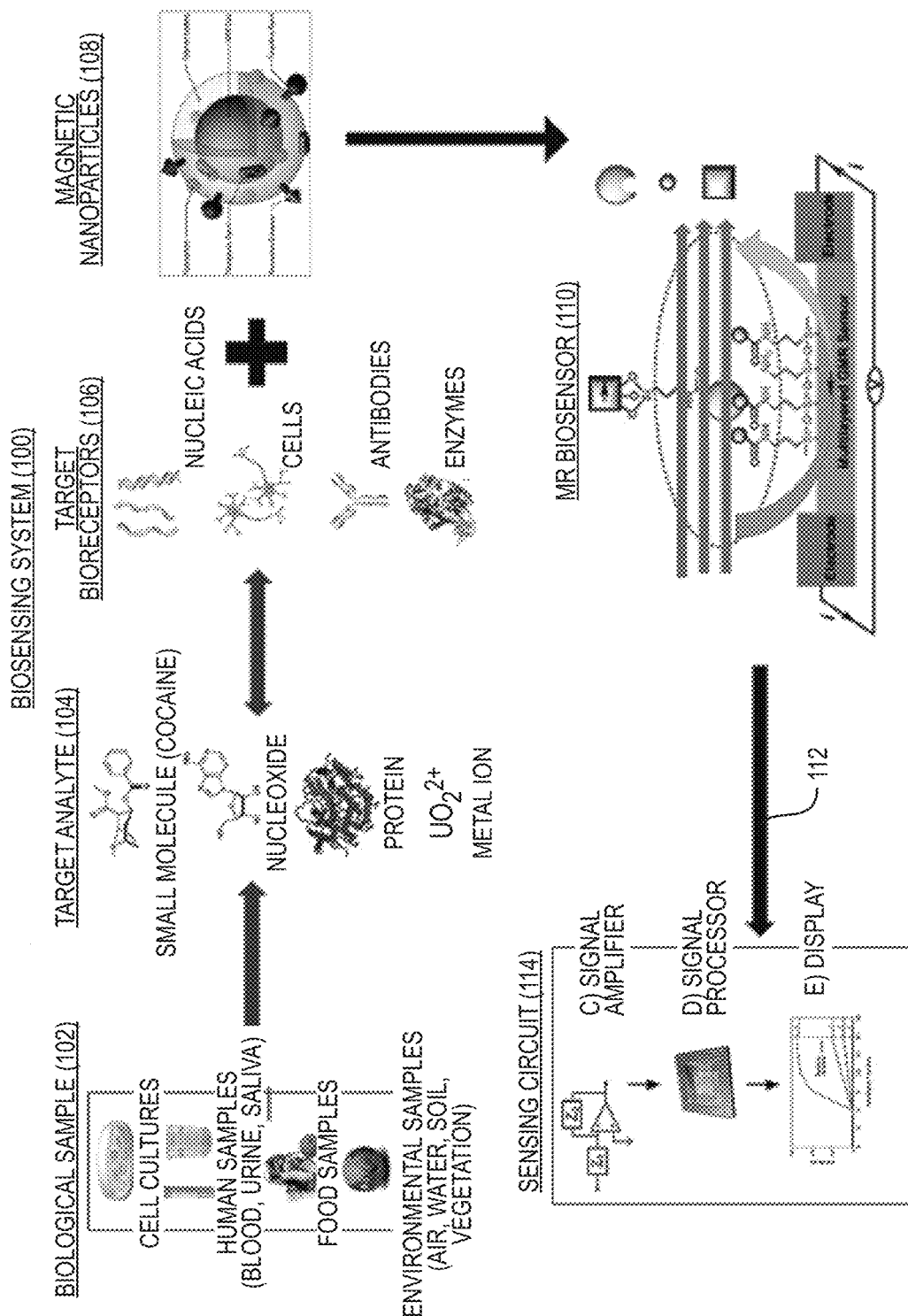
FIG. 1 is a schematic diagram of a biosensing system that employs a biosensor for detecting presence and/or properties of a biological sample.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects of the present disclosure involve tunnel magnetoresistive (TMR) sensors employing TMR devices with different magnetic field sensitivities for increased detection sensitivity. For example, a TMR sensor may be used as a biosensor to detect the presence of biological materials. The TMR sensor may be fabricated as a biosensor chip using semiconductor fabrication methods. The TMR sensor includes TMR devices that each include a magnetic tunnel junction (MTJ) comprised of a pinned ferromagnetic layer having a fixed magnetization (i.e., magnetic moment) and a free layer having a free layer magnetization that can rotate in the presence of a magnetic stray field, separated by a tunnel barrier. The change in resistance of a TMR device is a function of the change in the magnetization angle between its free layer and pinned layer. An external channel formed in the TMR sensor provides a biological active area to allow magnetic nanoparticles captured by bioreceptors bound to target analytes of interest to pass and be detected. A magnetic field can be applied to the magnetic nanoparticles to align their magnetic moments for generating a magnetic stray field in the free layers in the TMR devices as the magnetic nanoparticles pass in the external channel. As a result, the magnetic moments of the free layers are changed thus changing the magnetization angle between the free layers and their pinned layers, which changes the resistances of the TMR devices. A sensing circuit can be included in the TMR sensor to sense the changes in resistance in the TMR devices as a way to detect the presence and measure the magnetic nanoparticles passing through the external channel of the TMR sensor. The detection sensitivity of a TMR sensor is dependent on the minimum change in resistance that can be sensed by the sensing circuit included in the TMR sensor.

A greater change in resistance occurs in the TMR devices in the presence of a magnetic stray field when the fabrication of the TMR devices sets the magnetization angle between the free layer and the pinned layer larger towards orthogonal. As the magnetization angle between the free layer and the pinned layer is changed from orthogonal, less change in resistance occurs in a TMR device in the presence of a magnetic stray field. When a magnetic bias field is applied to the TMR sensor to align the magnetic moments of magnetic nanoparticles passing through the external channel, this magnetic field is also applied to the free layers of the TMR devices in the TMR sensor. This can cause the magnetic moments of the free layers to rotate and reduce the magnetization angle between their respective free layers and pinned layers in the TMR devices. Reducing the magnetization angle between a free layer and a pinned layer in a TMR device can reduce the detection sensitivity of the TMR sensor to a point where the change in resistance resulting from a magnetic stray field generated by the magnetic nanoparticles cannot be detected by the sensing circuit. This is because a smaller resistance change may occur in the presence of the magnetic stray field when the magnetization angle between the free layer and the pinned layer of a TMR device is reduced. Also, process variations can alter the magnetic properties of the TMR devices, during fabrication, such as MR ratio, magnetic anisotropy, and/or coercivity, and thus alter and potentially reduce the magnetization angle between their respective free layers and pinned layers in the TMR devices, thereby reducing the detection sensitivity of the TMR sensor. Also, the coercivity of the free layer can increase as the environmental temperature of the TMR sensor is reduced, thereby reducing the detection sensitivity of the TMR sensor.

Thus, in aspects disclosed herein, the free layers of at least two TMR devices in a TMR sensor are fabricated to exhibit different magnetic properties from each other (e.g., MR ratio, magnetic anisotropy, coercivity) so that each TMR device will exhibit a different change in resistance to a given magnetic stray field for increased magnetic field detection sensitivity. For example, the TMR devices may be fabricated to exhibit different magnetic properties such that one TMR device exhibits a greater change in resistance in the presence of a smaller magnetic stray field, and another TMR device exhibits a greater change in resistance in the presence of a larger magnetic stray field. As one example of providing TMR devices having different magnetic properties, TMR devices can be fabricated to having different magnetization angles between their free layers and the pinned layers at fabrication. For example, one TMR device in a TMR sensor may be fabricated to be more sensitive to smaller magnetic stray fields by increasing the magnetization angle between its free layer and pinned layer beyond orthogonal at fabrication. This can compensate for factors that may otherwise cause the magnetization angle between the free layer and pinned layer to be reduced, including rotation of the magnetic moment of the free layer due to application of a magnetic bias field to align the magnetization moments of the magnetic nanoparticles and/or change in magnetic properties due to process variations. Another TMR device may be fabricated to decrease the magnetization angle between its free layer and pinned layer lower than orthogonal to be more sensitive to larger magnetic stray fields. In another example, different TMR devices in a TMR sensor may be fabricated with free layers having different aspect ratios to compensate for variations in magnetic anisotropy and coercivity due to changes in environmental temperature for example. A smaller aspect ratio of the free layer provides greater magnetic field sensitivity for the TMR device.

Before discussing examples of TMR sensors that employ at least two TMR devices having different magnetic field sensitivities to increase detection sensitivity starting at FIG. 8, a TMR sensor that includes a TMR device that changes resistance based on an applied magnetic stray field is first discussed below with reference to FIGS. 3-7.

Figure 3:
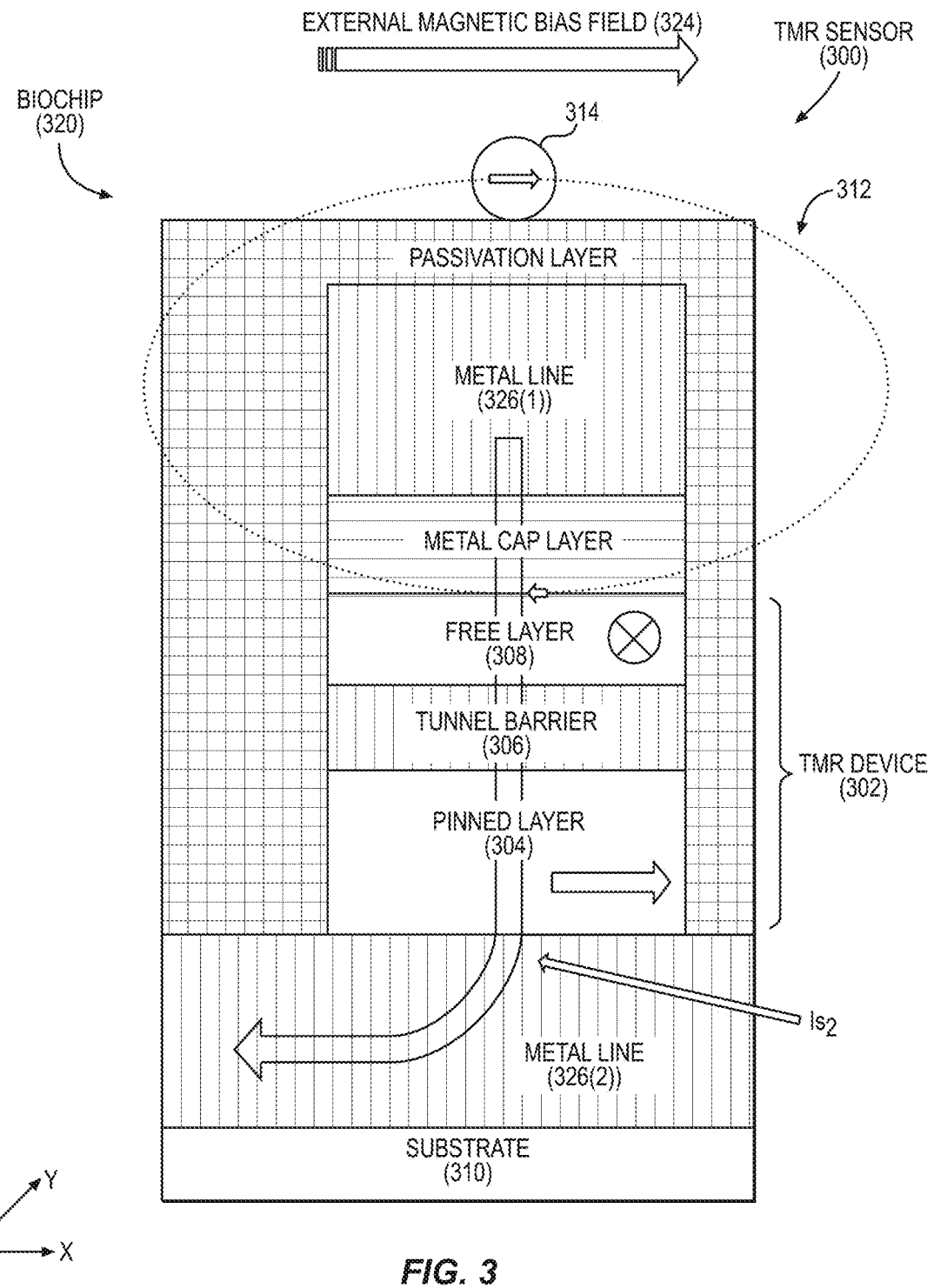
FIG. 3 is a schematic diagram of a tunnel magneto-resistive (TMR) sensor, that may be used as a biosensor, employing a TMR device in a chip whose resistance is configured to change in response to the presence of magnetic nanoparticles, which may be bound to a bioreceptor that is bound to a target analyte of interest, based on a TMR effect.

FIG. 3 illustrates a TMR sensor 300 that can be used as a biosensor to detect the presence of magnetic nanoparticles bound to a bioreceptor bound to a target analyte of interest. The TMR sensor 300 can be fabricated using standard very-large-scale integration (VLSI) fabrication technology. The TMR effect of the TMR sensor 300 originates from its ability to tunnel current to flow between two (2) ferromagnetic layers. The magnitude of the resistance of the TMR sensor 300 is dependent on the angle of magnetization between the two (2) ferromagnetic layers. In this regard, the TMR sensor 300 includes a TMR device 302 that includes a pinned layer 304 that has a fixed magnetization, a tunnel barrier 306, and a free layer 308 that has a free magnetization. The pinned layer 304 is formed on a substrate 310 and is a metal material (e.g., a Cobalt (Co) material) that has a fixed horizontal magnetization in the X direction. The tunnel barrier 306, comprised of an insulating material metal spacer, is disposed above the pinned layer 304. The free layer 308 is disposed above the tunnel barrier 306. The magnetization of the free layer 308, which is out-of-plane to the TMR device 302, has an orthogonal alignment with the in-plane magnetization of the pinned layer 304. The magnetic moment of the free layer 308 is configured to rotate based on a magnetic stray field 312 applied by magnetic nanoparticles 314 to the free layer 308. The magnetic stray field 312 is provided by the magnetization of the magnetic nanoparticles 314 captured by bioreceptors bound to a target analyte to be detected disposed external to the TMR sensor 300 such that the magnetic stray field 312 will interact with the free layer 308. For example, the magnetic nanoparticles 314 may be in a fluid form. Thus, the TMR sensor 300 may be provided as a biochip 320.

With continuing reference to FIG. 3, an external magnetic bias field 324, such as from an external coil, is applied to align the magnetic moments of the magnetic nanoparticles 314. The external magnetic bias field 324 may also saturate the magnetic moments of the magnetic nanoparticles 314. Thus, when the magnetic nanoparticles 314 are disposed above the free layer 308 of a first polarity, the magnetic stray field 312 of the magnetic nanoparticles 314 induces a magnetic moment change in the free layer 308 causing an angle variation of its magnetization state from an orthogonal or perpendicular magnetization state with respect to the magnetization of the pinned layer 304. This angle variation of magnetization between the free layer 308 and the pinned layer 304 creates a change in resistance in the TMR device 302 as compared to the orthogonal magnetization state of the free layer 308. This change in resistance resulting from disturbing the magnetic moment of the free layer 308 can be determined based on sensing a voltage change in the TMR device 302. For example, a sense current $I_{s2}$ can be directed to flow through the TMR device 302 between metal lines 326(1), 326(2) to measure the voltage across the metal lines 326(1), 326(2) based on the resistance of the TMR device 302 according to Ohm's law.

Figure 2:
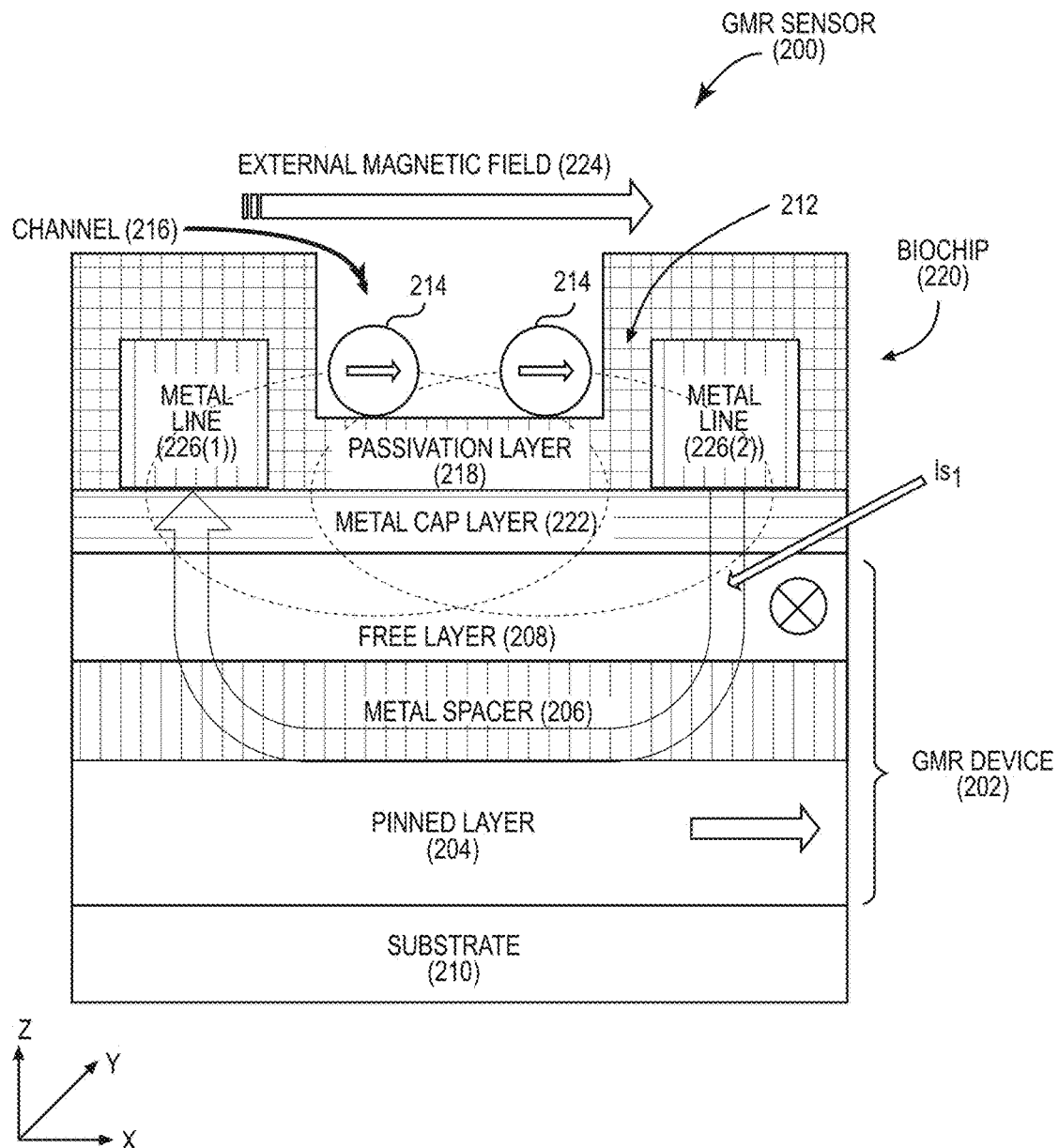
FIG. 2 is a schematic diagram of a giant magneto-resistive (GMR) sensor employing a GMR device in a chip whose resistance is configured to change in response to the presence of magnetic nanoparticles, which may be bound to a bioreceptor that is bound to a target analyte of interest, based on a GMR effect.

The TMR sensor 300 in FIG. 3 has advantages over the GMR sensor 200 in FIG. 2. The TMR sensor 300 has a higher MR ratio than the GMR sensor 200 in FIG. 2 to provide for a higher sensitivity of detecting the presence of the magnetic nanoparticles 314. For example, the MR ratio of the TMR device 302 may be between 100-300%, thereby providing a higher signal-to-noise ratio (SNR) of resistance change between the presence and lack of presence of the magnetic nanoparticles 314 resulting in a higher sensitivity device. Also, because the metal lines 326(1), 326(2) are not disposed adjacent to each other in the horizontal X direction, metal pitch is not an issue when scaling down the size of the TMR sensor 300. However, the external magnetic bias field 324 is also required beyond the biochip 320. Also, the magnetic nanoparticles 314 are separated a greater distance from the free layer 308 than separated in the GMR sensor 200 in FIG. 2 due to the current perpendicular-to-the-plane (CPP) design of the TMR sensor 300, thereby effectively reducing the improved SNR of the TMR sensor 300.

FIGS. 4A and 4B are exemplary magnetization diagrams 400, 402 of a magnetic moment 404 of the free layer 308 in the TMR device 302 in FIG. 3 when the magnetic stray field 312 is not present from magnetic nanoparticles (MNP) 314, and when the magnetic stray field 312 is generated in the presence of magnetic nanoparticles 314, respectively. As shown in FIG. 4A, the initial out-of-plane magnetic moment 404 of the free layer 308 is shown in orientation '0', which is orthogonal or perpendicular to an in-plane magnetic moment 406 of the pinned layer 308 in this example. The magnetic moment 404 of the free layer 308 can rotate with respect to the pinned layer 304 in the presence of a magnetic bias field 408. For example, the magnetic bias field 408 may be the external magnetic bias field 324 applied to align the magnetic moments of the magnetic nanoparticles 314 in the TMR sensor 300 shown in FIG. 3. Exemplary rotational positions of the magnetic moment 404 of the free layer 308 are shown as magnetic moment orientations '0', '1', '2', and '3'. The magnetization angle $\Theta_1$ is the angle between the direction of the magnetic moment 404 of the free layer 308 and the direction of the magnetic moment 406 of the pinned layer 304. The rotation of the magnetic moment 404 of the free layer 308 is dependent on magnetic field strength of the magnetic bias field 408. In FIG. 4B, both the magnetic bias field 408 and the magnetic stray field 312 from the magnetic nanoparticles 314 are applied to the free layer 308. The magnetic stray field 312 from the magnetic nanoparticles 314 being applied to the free layer 302 of the TMR device 302 in FIG. 3 also contributes to the rotation of the magnetic moment 404 of the free layer 308.

The resistance of the TMR device 302 is dependent on the magnetization angle $\Theta_1$ between the magnetic moment 404 of the free layer 308 and the magnetic moment 406 of the pinned layer 304. This is shown plotted in a graph 500 in FIG. 5 illustrating an exemplary reference resistance (R), magnetic field strength (H) (RH) curve 502 illustrating the resistance R (Y-axis) of the TMR device 302 in FIG. 3 for a given magnetic field strength (H) (X-axis) of a magnetic field(s) applied to the free layer 308. The resistance R of the TMR device 302 is shown plotted in FIG. 5 for the magnetic moment orientations '0', '1', '2', and '3'. As shown in FIG. 5, resistances $R_0$, $R_1$, $R_2$, and $R_3$ correspond to magnetic moment orientations '0', '1', '2', and '3' of the magnetic moment 404 of the free layer 308. Slopes $S_1$, $S_2$, and $S_3$ between resistances $R_0$ and $R_1$, $R_1$ and $R_2$, and $R_2$ and $R_3$, respectively, decrease as the magnetization angle $\Theta_1$ between the magnetic moment 404 of the free layer 308 and the magnetic moment 406 of the pinned layer 304 decreases. In other words, as the magnetization angle $\Theta_1$ between the magnetic moment 404 of the free layer 308 and the magnetic moment 406 of the pinned layer 304 decreases, the magnetic sensitivity of the TMR device 302 (i.e., change in resistance R/change in external magnetic field strength H) decreases. As the magnetization angle $\Theta_1$ between the free layer 308 and the pinned layer 304 is changed from orthogonal, less change in resistance R occurs in the TMR device 302 in the presence of an applied magnetic field. Thus, the TMR device 302 is most sensitive when the magnetic moment 404 of the free layer 308 is orthogonal or perpendicular to the pinned layer 304.

With reference back to FIG. 4B, when the magnetic bias field 408 is applied to the TMR device 302 to align the magnetic moments of magnetic nanoparticles 314, the magnetic bias field 408 is also applied to the free layer 308 of the TMR device 302. This can cause the magnetic moment 404 of the free layer 308 to initially rotate and reduce the magnetization angle $\Theta_1$ between the free layer 308 and the pinned layer 304 in the TMR device 302. Reducing the magnetization angle $\Theta_1$ between the free layer 308 and the pinned layer 304 can reduce the detection sensitivity of the TMR sensor 300 to a point where the change in resistance R resulting from the magnetic stray field 312 generated by the magnetic nanoparticles 314 cannot be detected by a sensing circuit. This is because a smaller change in resistance R may occur in the presence of the magnetic stray field 312 when the magnetization angle $\Theta_1$ between the free layer 308 and the pinned layer 304 of the TMR device 302 is reduced. Then, when the magnetic stray field 312 from the magnetic nanoparticles 314 is applied to the free layer 308, the magnetization angle $\Theta_1$ between the free layer 308 and the pinned layer 304 may be further reduced.

Process variations can also alter the magnetic properties of the TMR device 302, during fabrication, such as MR ratio, magnetic anisotropy, and/or coercivity, and thus alter and potentially reduce the magnetization angle $\Theta_1$ between their respective free layer 308 and the pinned layer 304, thereby reducing the detection sensitivity of the TMR sensor 300. Also, the coercivity of the free layer 308 can also increase as the environmental temperature of the TMR device 302 is reduced, thereby reducing the detection sensitivity of the TMR sensor 300.

Figure 6:
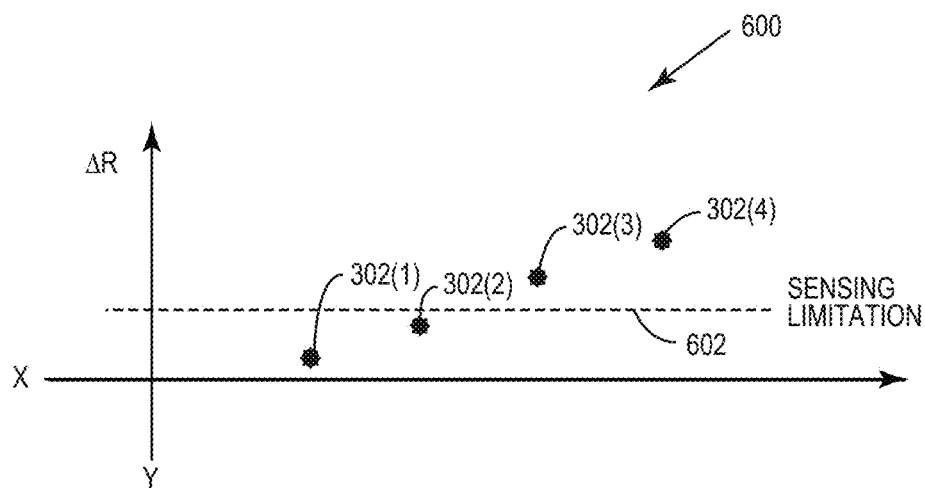
FIG. 6 is a graph illustrating exemplary magnetic field detection sensitivities of TMR devices being below or above a change in resistance sensing limitation as a function of their change in the magnetization angle between the free layer and the pinned layer in the presence of an external magnetic field applied to the free layer, based on process variations and/or environment that affect the magnetization of the free layer.
Figure 7:
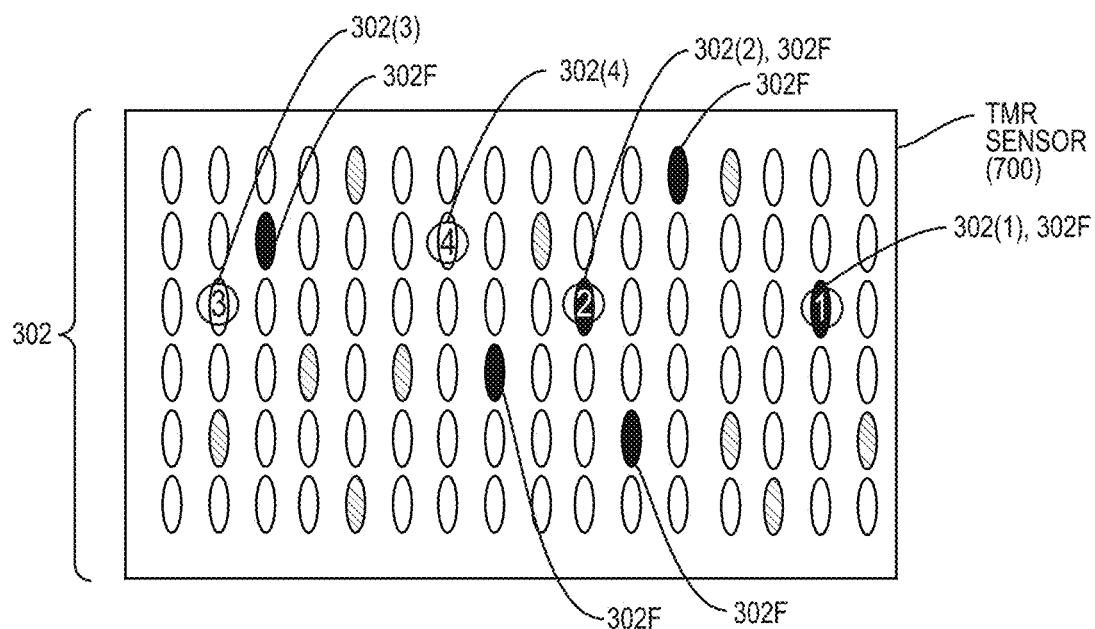
FIG. 7 illustrates a top view of a TMR sensor employing TMR devices of different magnetic field detection sensitivities shown in the graph in FIG. 6.

FIG. 6 is a graph 600 illustrating exemplary magnetic field detection sensitivities of TMR devices 302(1)-302(4) (on X-axis) similar to the TMR device 302 in FIG. 3, being below or above a change in resistance of a sensing limitation line 602 as a function of their change in resistances $\Delta R$ (Y-axis) for the magnetic field strength of a given applied magnetic field. As discussed above, the initial magnetization angle between the respective free layer and the pinned layer of the TMR devices 302(1)-302(4) affects the starting orientation of the magnetic moment of the free layer, which then affects the magnetic sensitivity of the TMR devices 302(1)-302(4). FIG. 7 illustrates a top view of a TMR sensor 700 employing a plurality of TMR devices 302, including the TMR devices 302(1)-302(4) in FIG. 6. Depending on the magnetic sensitivity of the TMR devices 302 and the magnetic field strength of magnetic nanoparticles that pass across the TMR devices 302, the change in resistance $\Delta R$ in the TMR devices 302 as a result of passing of magnetic nanoparticles may or may not be detectable depending on the detection sensitivity of a sensing circuit employed to detect the change in resistance $\Delta R$. The TMR devices 302 that have a magnetic sensitivity below a designed or specified sensing limitation (e.g., the sensing limitation line 602 in FIG. 6) will be deemed failed devices, which may also cause the TMR sensor 700 to be deemed a failed sensor. For example, TMR devices 302F shown in the TMR sensor 700 in FIG. 7 are deemed failed devices. TMR devices 302(1) and 302(2) shown in FIG. 6 are also shown in the TMR sensor 700 in FIG. 7 as failed TMR devices 302F.

To improve the magnetic sensitivity of TMR devices employed in a TMR sensor, different TMR devices in a TMR sensor may be fabricated to exhibit different magnetic properties from each other so that each TMR device will exhibit a different change in resistance to a given magnetic stray field for increased magnetic field detection sensitivity. For example, these magnetic properties of the TMR devices include aspects that affect the MR ratio of the TMR device, magnetic anisotropy of the free layers in the TMR devices, and coercivity of the free layers in the TMR devices. For example, TMR devices in a TMR sensor may be fabricated to exhibit different magnetic properties such that one or more TMR devices in the TMR sensor exhibits a greater change in resistance in the presence of a smaller magnetic stray field. One or more other TMR devices in the TMR sensor may be fabricated to exhibit a greater change in resistance in the presence of a larger magnetic stray field. As one example of providing TMR devices having different magnetic properties, TMR devices can be fabricated to have different magnetization angles between their free layers and the pinned layers at fabrication.

Figure 8:
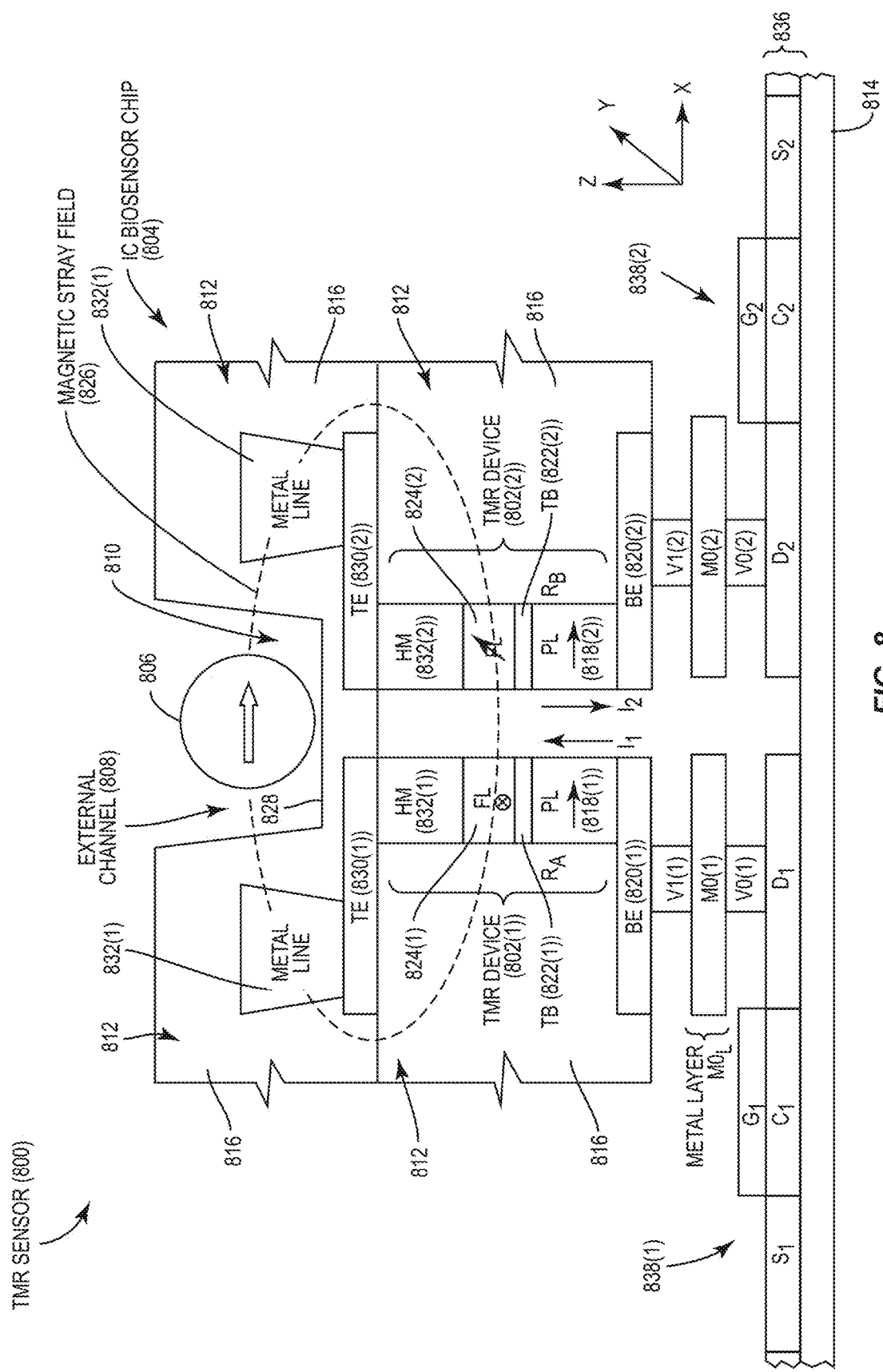
FIG. 8 is a side view of an exemplary TMR sensor that includes multiple TMR devices, wherein at least two TMR devices are provided to increase magnetic field detection sensitivity.

In this regard, FIG. 8 is a side view of an exemplary TMR sensor 800 that includes multiple, first and second TMR devices 802(1)-802(2) that can each be fabricated to exhibit different magnetic properties from each other so that each TMR device 802(1), 802(2) will exhibit a different change in resistance to a given magnetic stray field for increased magnetic field detection sensitivity. The TMR sensor 800 may be provided in an integrated circuit (IC) biosensor chip 804. As will be discussed in more detail below, the first and second TMR devices 802(1), 802(2) are configured to provide TMR sensing of resistance change in response to the presence of magnetic nanoparticles 806, which may be bound to a bioreceptor that is bound to a target analyte of interest, in an external channel 808 adjacent to the TMR devices 802(1), 802(2). The external channel 808 is formed in a void 810 in an encapsulation material 812 that encompasses the TMR devices 802(1), 802(2) such that the external channel 808 can capture the magnetic nanoparticles 806 without the magnetic nanoparticles 806 physically contacting the internal components of the TMR sensor 800 including the TMR devices 802(1), 802(2). The TMR devices 802(1), 802(2) are disposed above a substrate 814 and are disposed in the encapsulation material 812, which may include a passivation material 816 (i.e., an interlayer dielectric (ILD) material) formed above the substrate 814. The X, Y, and Z coordinates of the TMR devices 802(1), 802(2) are shown in FIG. 8. The X and Z coordinates are in-plane to the TMR devices 802(1), 802(2). The Y coordinate is out-of-plane to the TMR devices 802(1), 802(2).

Figure 9:
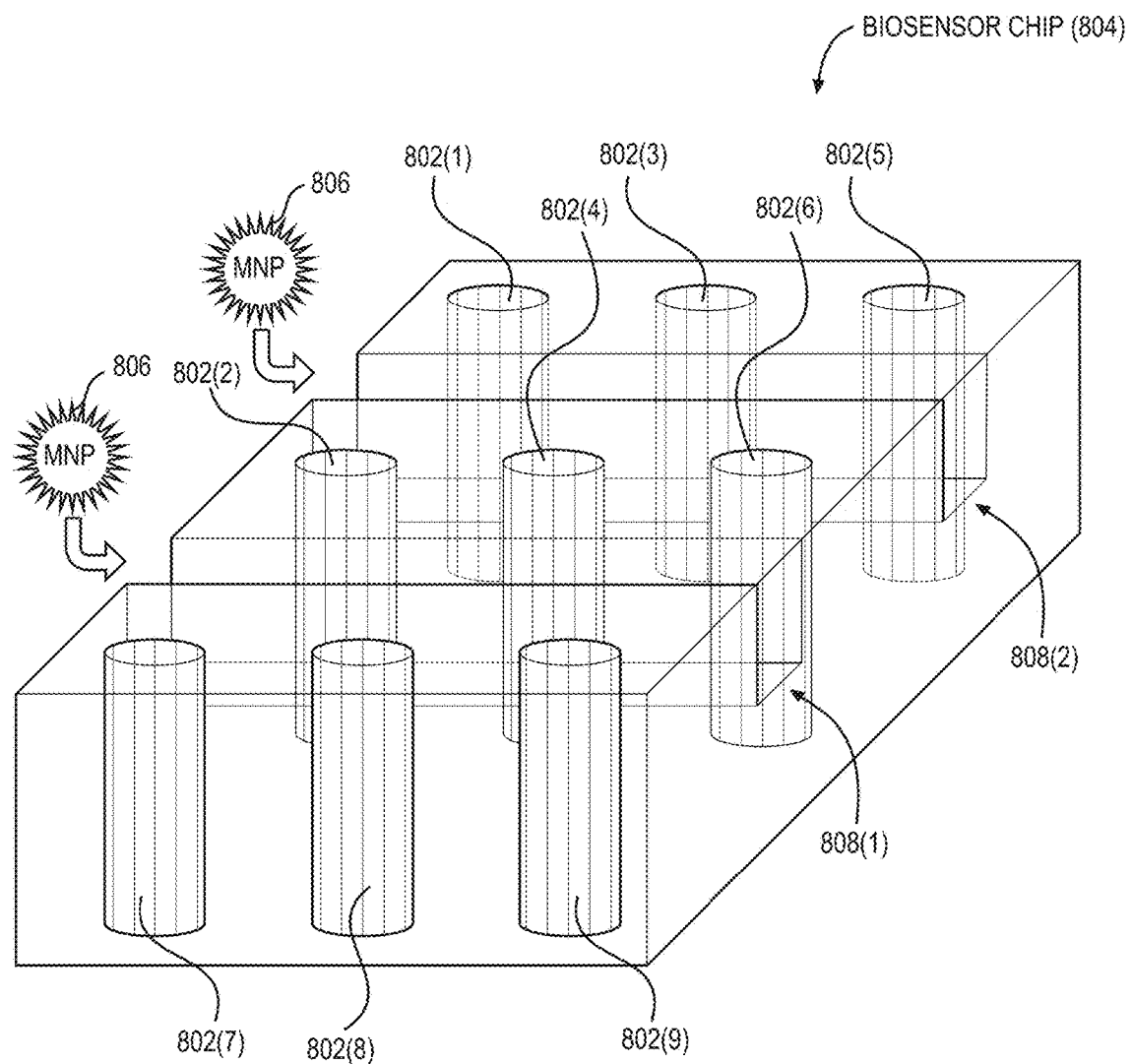
FIG. 9 is a schematic diagram of an exemplary biosensor chip employing a plurality of the TMR sensors in FIG. 8 for detecting magnetic nanoparticles.

Note that although two TMR devices 802(1), 802(2) are shown in the TMR sensor 800 in FIG. 8, more than two TMR devices (not shown) can be included in the TMR sensor 800 in FIG. 8. For example, additional TMR devices 802(3), 802(4) can be provided in the IC biosensor chip 804 for the TMR sensor 800 adjacent to the two TMR devices 802(1), 802(2) in the X-axis direction. The additional TMR devices 802(3), 802(4) could be provided in the IC biosensor chip 804 behind or in front of the two TMR devices 802(1), 802(2) in the Y-axis direction as shown in FIG. 9 for example. Additional TMR devices 802(5), 802(6) can be located in the IC biosensor chip 804 adjacent to the TMR devices 802(3), 802(4). TMR devices 802(1)-802(6) are each located adjacent to an external channel 808(1) in the IC biosensor chip 804. TMR devices 802(2), 802(4), 802(6) are also located adjacent to another external channel 808(2) in the IC biosensor chip 804, across from additional TMR devices 802(7), 802(8), 802(9). Any of the TMR devices 802(1)-802(9) in the IC biosensor chip 804 in FIG. 9 located adjacent to each other on each side of an external channel 808(1), 808(2) are applicable to the discussion of the example of the first and second TMR devices 802(1), 802(2) in FIG. 8. Any of the TMR devices 802(1)-802(9) may have varying magnetic characteristics from each other to increase their magnetic sensitivity, and thus the detection sensitivity of the TMR sensor 800.

With reference back to FIG. 8, the TMR devices 802(1), 802(2) each have first and second resistances $R_A$, $R_B$, respectively, based on their layer stackups. In this regard, the first TMR device 802(1) has a first pinned layer (PL) 818(1) having a first pinned layer magnetization (i.e., magnetic moment) in a direction of the X-axis. The first pinned layer 818(1) is disposed above and in electrical contact with a first bottom electrode (BE) 820(1). A first spacer comprised of a first tunnel barrier (TB) 822(1) made from an insulating material (e.g., Aluminum Oxide (AlOx) or Magnesium Oxide (MgO)) is disposed above the first pinned layer 818(1). A first free layer (FL) 824(1) is disposed above the first tunnel barrier 822(1) having a first free layer magnetization (i.e., magnetic moment) in a direction of the Y-axis out-of-plane or substantially out-of-plane to the TMR device 802(1) and orthogonal to the direction of the X-axis. Thus, the first tunnel barrier 822(1) forms a magnetic tunnel junction (MTJ).

The magnetic moment of the first free layer 824(1) is configured to rotate from the direction of the Y-axis towards the direction of the X-axis in response to the presence of the magnetic field applied to the first free layer 824(1). For example, as discussed previously, an external magnetic bias field may also be applied to the external channel 808 to align the magnetic moments of the magnetic nanoparticles 806, which may also be applied to the first free layer 824(1). Also, magnetic nanoparticles 806 in the external channel 808 exert a magnetic stray field 826 on the first free layer 824(1). A bottom surface 828 of the external channel 808 is disposed above and adjacent to the first TMR device 802(1) so that the magnetic stray field 826 generated by the magnetic nanoparticles 806 is applied to the first free layer 824(1), thereby causing the magnetic moment of the first free layer 824(1) to rotate towards the magnetization direction of the pinned layer 818(1). This rotation of the magnetic moment of the first free layer 824(1) causes the magnetization angle to change between the first free layer 824(1) and the first pinned layer 818(1). In response, the first resistance $R_A$ of the first TMR device 802(1) changes as a result of the magnetic stray field 826 from the magnetic nanoparticles 806 being applied to the first free layer 824(1). As will be discussed in more detail below, the magnetic properties of the first TMR device 802(1) will affect the initial magnetic orientation of the first free layer 824(1), and thus the magnetization angle between the first free layer 824(1) and the first pinned layer 818(1) as a result of a magnetic field, including an external magnetic field and the magnetic stray field 826 from the magnetic nanoparticles 806 being applied to the first free layer 824(1).

Similarly, with continuing reference to FIG. 8, the second TMR device 802(2) has a second pinned layer (PL) 818(2) having a first magnetization in the direction of the X-axis. The second pinned layer 818(2) is disposed above and in electrical contact with a second bottom electrode (BE) 820(2). A first spacer comprised of a second tunnel barrier (TB) 822(2) made from an insulating material (e.g., Aluminum Oxide (AlOx) or Magnesium Oxide (MgO)) is disposed above the second pinned layer 818(2). A second free layer (FL) 824(2) is disposed above the second tunnel barrier 822(2) having the second magnetization in the direction of the Y-axis orthogonal to the X-axis. Thus, the second tunnel barrier 822(2) forms an MTJ. The magnetic moment of the second free layer 824(2) is configured to rotate from the direction of the Y-axis towards the direction of the X-axis opposite from the rotation of the first free layer 824(1) in response to the presence of the magnetic nanoparticles 806 in the external channel 808 exerting the magnetic stray field 826 from the magnetic nanoparticles 806 on the second free layer 824(2). This rotation of the magnetic moment of the second free layer 824(2) causes the magnetization of the second free layer 824(2) to change between the second free layer 824(2) and the second pinned layer 818(2). In response, the second resistance $R_B$ of the second TMR device 802(2) changes as a result of a magnetic field, including any external magnetic field and the magnetic stray field 826 from the magnetic nanoparticles 806, being applied to the second free layer 824(2).

Note that the first and second TMR devices 802(1), 802(2) could alternatively be fabricated such that their first and second free layers 824(1), 824(2) are disposed below the first and second tunnel barriers 822(1), 822(2) closer to the bottom electrodes 820(1), 820(2) and the substrate 814, and their first and second pinned layers 818(1), 818(2) could be disposed above the first and second tunnel barriers 822(1), 822(2).

With continuing reference to FIG. 8, the first and second TMR devices 802(1), 802(2) are disposed between and in electrical contact with the first and second bottom electrodes 820(1), 820(2) and top electrodes (TE) 830(1), 830(2). The first bottom electrode 820(1) is disposed below and in electrical contact with the first TMR device 802(1), and the first pinned layer 818(1) in this example. The first top electrode 830(1) is disposed above and also in electrical contact with the first TMR device 802(1), and the first free layer 824(1) in this example. A hard mask (HM) 832(1) disposed above the first free layer 824(1) and in contact with the first top electrode 830(1) protects the TMR device 802(1) during fabrication processes, such as during etching. The first TMR device 802(1) is configured to carry a first current $I_1$ between the first bottom electrode 820(1) and the first top electrode 830(1) in response to a first voltage differential applied between the first bottom electrode 820(1) and the first top electrode 830(1) based on the first resistance $R_A$ of the first TMR device 802(1). The change in the first resistance $R_A$ of the first TMR device 802(1) in response to an applied magnetic field to the first free layer 824(1) is a function of the magnetic sensitivity of the first TMR device 802(1).

Similarly, the second bottom electrode 820(2) is disposed below and in electrical contact with the second TMR device 802(2), and the second pinned layer 818(2) in this example. The second top electrode 830(2) is disposed above and also in electrical contact with the second TMR device 802(2), and the second free layer 824(2) in this example. A hard mask (HM) 832(2) disposed above the second free layer 824(2) and in contact with the second top electrode 830(2) protects the TMR device 802(2) during fabrication processes, such as during etching. The second TMR device 802(2) is configured to carry a second current $I_2$ between the second bottom electrode 820(2) and the second top electrode 830(2) in response to a second voltage differential applied between the second bottom electrode 820(2) and the second top electrode 830(2) based on the second resistance $R_B$ of the second TMR device 802(2). The change in the second resistance $R_B$ of the second TMR device 802(2) in response to an applied magnetic field to the second free layer 824(2) is a function of the magnetic sensitivity of the second TMR device 802(2).

As will be discussed below, these currents $I_1$, $I_2$ can be sensed to generate signals, including but not limited to differential signals, indicative of the differential change in resistances $R_A$, $R_B$ in the first and second TMR devices 802(1), 802(2) in response to the magnetic nanoparticles 806 passing through the external channel 808.

With continuing reference to FIG. 8, first and second metal lines 832(1), 832(2) are disposed above and in electrical contact with the respective top electrodes 830(1), 830(2). For example, the metal lines 832(1), 832(2) may form bit lines for applying a voltage across the TMR devices 802(1), 802(2) between the top electrodes 830(1), 830(2) and the bottom electrodes 820(1), 820(2). In this regard, the bottom electrodes 820(1), 820(2) are in electrical contact with one or more vertical interconnect accesses (vias), which in this example are vias V1(1), V1(2), which are in contact with metal lines M0(1), M0(2) in a first metal layer $MO_L$. Vias V0(1), V0(2) are in contact with the metal lines M0(1), M0(2) to couple devices in an active semiconductor layer 836 to the TMR devices 802(1), 802(2). For example, access transistors 838(1), 838(2) formed in the active semiconductor layer 836 may be coupled through the vias V0(1), V0(2), V1(1), V1(2) and metal lines M0(1), M0(2) to the TMR devices 802(1), 802(2) to control providing a current path from the top electrodes 830(1), 830(2) to the bottom electrodes 820(1), 820(2). For example, access transistor 838(1) includes a gate $G_1$ that controls conduction through a channel $C_1$ between a source $S_1$ and a drain $D_1$. Access transistor 838(2) includes a gate $G_2$ that controls conduction through a channel $C_2$ between a source $S_2$ and a drain $D_2$. The drains $D_1$, $D_2$ are coupled to the TMR devices 802(1), 802(2). When it is desired to provide a current path through the TMR devices 802(1), 802(2), the gates $G_1$, $G_2$ of the access transistors 838(1), 838(2) are controlled to activate the conduction path in the channels $C_1$, $C_2$ to create a current path in the TMR devices 802(1), 802(2) between the drains $D_1$, $D_2$ and the metal lines 832(1), 832(2). For example, the gates $G_1$, $G_2$ of the access transistors 838(1), 838(2) may be word lines that are controlled by sensing circuitry.

With continuing reference to FIG. 8, the first and second TMR devices 802(1), 802(2) in the TMR sensor 800 can also be configured to provide differential sensing of the magnetic nanoparticles 806 to improve the SNR of the TMR sensor 800. For example, the first and second TMR devices 802(1), 802(2) can be arranged such that their free layers 824(1), 824(2) rotate in opposite directions in response to the applied magnetic stray field 826, such that their first and second resistances $R_A$, $R_B$ also change in opposite manners. For example, in the TMR sensor 800 in FIG. 8, the first resistance $R_A$ of the first TMR device 802(1) may increase by a certain first delta resistance (e.g., in the range of micro-Ohms or nano-Ohms) as the orthogonal magnetization state of the first free layer 824(1) rotates away from the magnetization state of the pinned layer 818(1). The second resistance $R_B$ of the second TMR device 802(2) may decrease by a certain second delta resistance (e.g., in the range of micro-Ohms or nano-Ohms) as the magnetization state of the second free layer 824(2) rotates towards the magnetization of the pinned layer 818(2).

The TMR sensor 800 in FIG. 8 may enjoy other advantages. For example, the MR ratio of the TMR devices 802(1), 802(2) may be between 60%-500%, and typically between 100%-300% to provide a higher SNR. Coupled with the differential TMR sensing, the SNR is further increased. The size of the first and second TMR devices 802(1), 802(2) may be scalable down to nanometers (nm) (e.g., 40-100 nm). The first and second resistances $R_A$, $R_B$ of the first and second TMR devices 802(1), 802(2) are affected by their magnetic field sensitivities, which are affected by factors such as junction sizes of their first and second tunnel barriers 822(1), 822(2), the magnetic anisotropy of the free layers 824(1), 824(2) and the pinned layers 818(1), 818(2), and the coercivity of the free layers 824(1), 824(2). Sizing of the TMR sensor 800 may be important depending on the application, such as for a wearable or point-of-care device. For example, the sensitivity of the TMR sensor 800 may need to be designed to be different for a wearable or point-of-care device. The application and fabrication temperature of the first and second TMR devices 802(1), 802(2) may be able to be increased to higher temperatures (e.g., 300-400 Celsius), because the first and second tunnel barriers 822(1), 822(2) are made from non-metallic insulating materials that will not diffuse before 400 Celsius for example.

Figure 10:
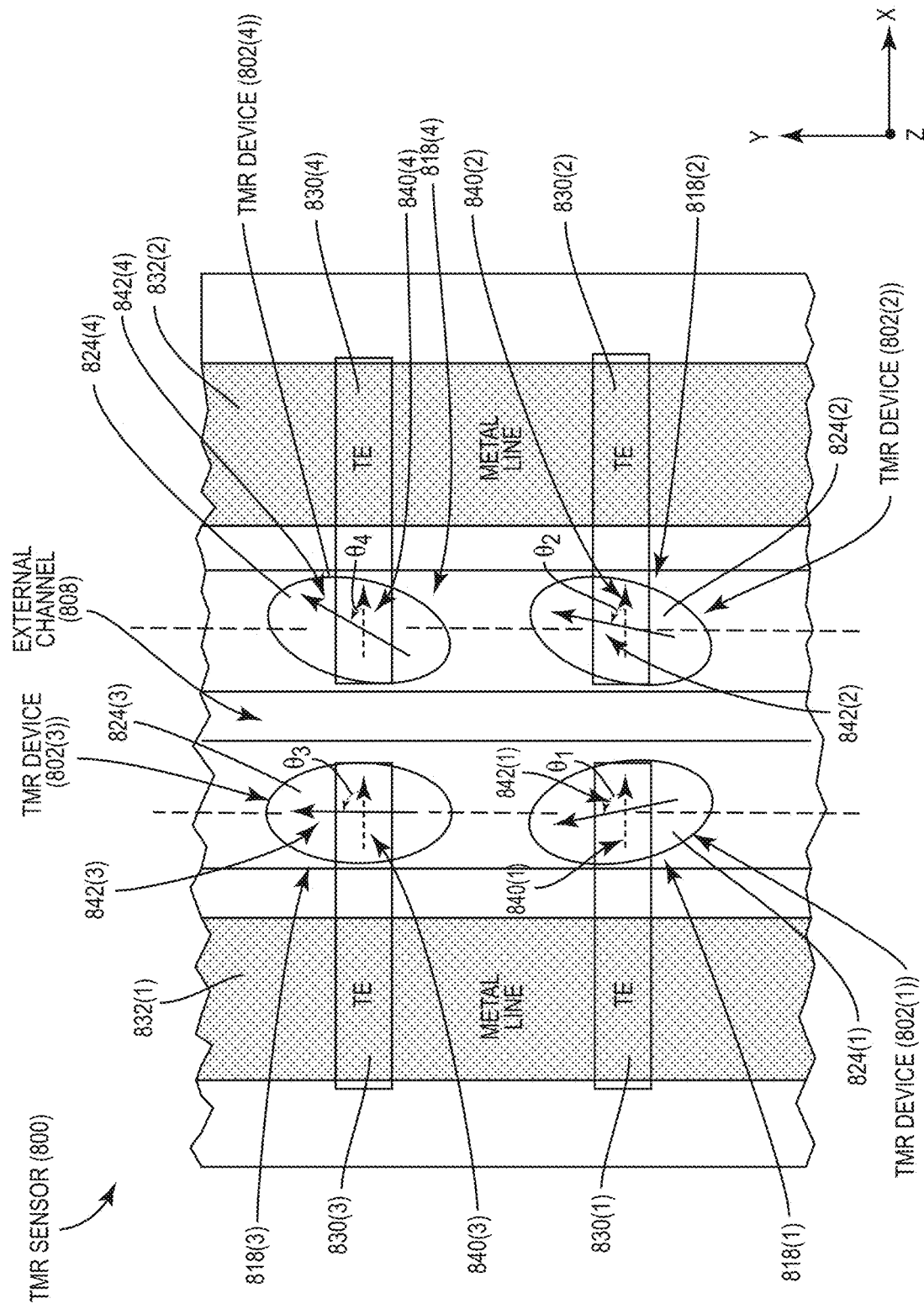
FIG. 10 is a top view of one example of the TMR sensor in FIG. 8 wherein multiple TMR devices have different magnetic field sensitivities in the form of varying magnetization angles between their respective free layers and pinned layers to increase magnetic field detection sensitivity.

FIG. 10 is a top view of one example of the TMR sensor 800 in FIG. 8 to provide multiple TMR devices having different magnetic field sensitivities to exhibit a different change in resistance to a given magnetic stray field for increased magnetic field detection sensitivity. For example, these magnetic properties of the TMR devices include aspects that affect the MR ratio of the TMR devices, magnetic anisotropy of the free layers in the TMR devices, and coercivity of the free layers in the TMR devices. For example, TMR devices in a TMR sensor may be fabricated to exhibit different magnetic properties such that one or more TMR devices in the TMR sensor exhibits a greater change in resistance in the presence of a smaller magnetic stray field. One or more other TMR devices in the TMR sensor may be fabricated to exhibit a greater change in resistance in the presence of a larger magnetic stray field. As one example of providing TMR devices having different magnetic properties, TMR devices can be fabricated to have different magnetization angles between their free layers and the pinned layers at fabrication. In the example, the TMR devices 802(1), 802(2) shown in FIG. 8 are shown in FIG. 10. Two other TMR devices 802(3), 802(4) that include similar structures like that shown for the TMR devices 802(1), 802(2) in FIG. 8 are also shown. TMR devices 802(1), 802(2) are adjacent to each other in the direction of the X-axis on opposite sides of the external channel 808, and are aligned substantially orthogonal to the Y-axis. TMR devices 802(1), 802(3) are adjacent to each other in the direction of the Y-axis, and are aligned substantially orthogonal to the X-axis. The TMR devices 802(2), 802(4) are adjacent to each other in the direction of the Y-axis, and are aligned substantially orthogonal to the X-axis.

With continuing reference to FIG. 10, the pinned layers 818(1)-818(4) of the TMR devices 802(1)-802(4) each have pinned layer magnetizations 840(1)-840(4), which are each in-plane in the X-axis direction in this example. The first free layer 824(1) has a first free layer magnetization 842(1) that is rotated away from the first pinned layer 818(1) at a first magnetization angle $\Theta_1$ that is not orthogonal to the pinned layer magnetization 840(1). The resistance of the first TMR device 802(1) is a function of the first magnetization angle $\Theta_1$. For example, the first magnetization angle $\Theta_1$ may be between approximately one hundred (100) and one hundred twenty (120) degrees in this example. The second free layer 824(2) has a second free layer magnetization 842(2) that is rotated towards the second pinned layer 818(2) at a second magnetization angle $\Theta_2$ that is not orthogonal to the pinned layer magnetization 840(2). The resistance of the second TMR device 802(2) is a function of the second magnetization angle $\Theta_2$. For example, the second magnetization angle $\Theta_2$ may be between approximately sixty (60) and eighty (80) degrees in this example. The third free layer 824(3) has a third free layer magnetization 842(3) that is rotated towards the third pinned layer 818(3) at a third magnetization angle $\Theta_3$ that is orthogonal to the pinned layer magnetization 840(2). The resistance of the third TMR device 802(3) is a function of the third magnetization angle $\Theta_3$. The fourth free layer 824(4) has a fourth free layer magnetization 842(4) that is rotated towards the fourth pinned layer 818(4) at a fourth magnetization angle $\Theta_4$ that is not orthogonal to the pinned layer magnetization 840(4). The resistance of the fourth TMR device 802(4) is a function of the fourth magnetization angle $\Theta_4$. For example, the fourth magnetization angle $\Theta 4$ may be between approximately forty (40) and sixty (60) degrees in this example.

The TMR devices 802(1)-802(4) are each configured to exhibit changes in their resistances, in response to the magnetic stray field 826 applied to their free layers 824(1)-824(4) as a function of their respective magnetization angles $\Theta_1$-$\Theta_4$ between their respective free layers 824(1)-824(4) and their pinned layers 818(1)-818(4). In this manner, because the magnetization angle $\Theta_1$-$\Theta_4$ of the TMR devices 802(1)-802(4) are different, their magnetic sensitivities will be different and thus their change in resistances in response to the magnetic stray field 826 applied to their free layers 824(1)-824(4) will be at different change rates. This facilitates providing different detection sensitivities in the TMR sensor 800 for different sizes and/or volumes of magnetic nanoparticles 806. The different magnetic sensitivities of the TMR devices 802(1)-802(4) can compensate for process variations that affect the magnetic properties of the TMR devices 802(1)-802(4) during fabrication, such as their MR ratio, magnetic anistropy, and/or coercivity, and thus alter and potentially reduce their magnetization angles $\Theta_1$-$\Theta_4$ between their respective free layers 824(1)-824(4) and their pinned layers 818(1)-818(4), which could otherwise reduce the detection sensitivity of the TMR sensor 800. For example, the magnetization angles $\Theta_1$-$\Theta_4$ may be different by more than at least approximately ten (10) degrees between at least two TMR devices 802(1)-802(4) in the TMR sensor 800 in FIG. 10.

In another example, different TMR devices in the TMR sensor 800 may be fabricated with free layers having different aspect ratios to compensate for variations in magnetic anisotropy and coercivity due to changes in environmental temperature for example. A smaller aspect ratio of the free layer provides greater magnetic field sensitivity for the TMR device.

Figure 11:
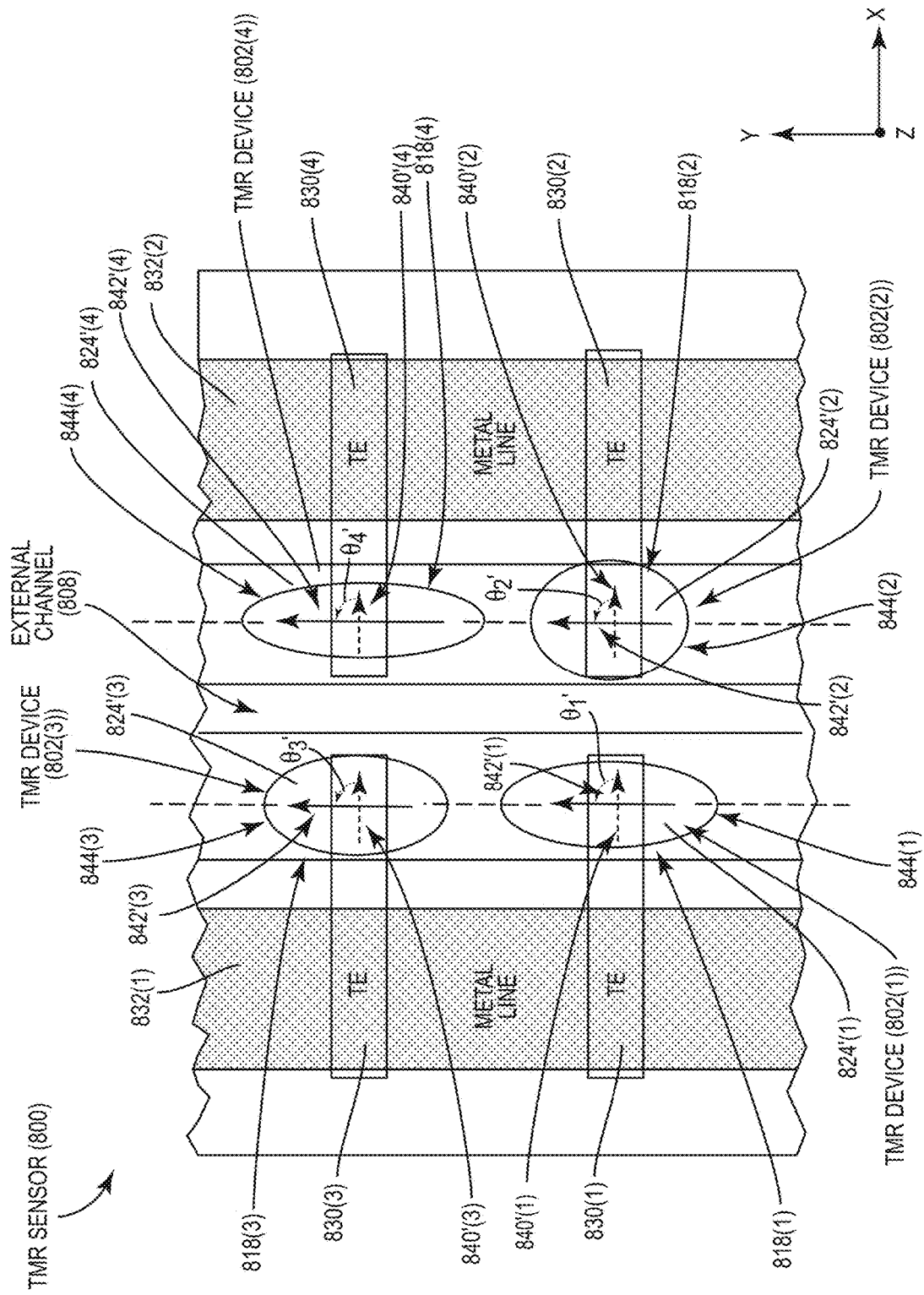
FIG. 11 is a top view of another example of the TMR sensor in FIG. 8 wherein at least two TMR devices have different magnetic field sensitivities in the form of varying aspect ratios of their respective free layers to increase magnetic field detection sensitivity.

In this regard, FIG. 11 is a top view of another example of the TMR sensor 800 in FIG. 8, wherein at least two TMR devices have different magnetic field sensitivities in the form of varying aspect ratios of their respective free layers to increase magnetic field detection sensitivity. Common elements between FIGS. 10 and 11 are shown with common element numbers in FIGS. 10 and 11 and thus will not be reintroduced or redescribed. In this example, the TMR devices 802(1)-802(4) have first free layers 824'(1)-824'(4) that have respective free layer magnetizations 842'(1)-842'(4) at magnetization angles $\Theta_1'$-$\Theta_4'$ orthogonal to the pinned layer magnetizations 840'(1)-840'(4) of the pinned layers 818'(1)-814'(4). The resistances of the TMR devices 802(1)-802(4) are a function of the magnetization angles $\Theta_1'$-$\Theta_4'$. The resistances of the TMR devices 802(1)-802(4) are also functions of the aspect ratios 844(1)-844(4) of the free layers 824'(1)-824'(4). In this example, the first free layer 824'(1) has a first aspect ratio 844(1) with the easy axis of the first free layer 824'(1) elongated in the Y-axis direction over the X-axis direction. For example, the first aspect ratio 844(1) may be between approximately 3.5 and 4.5 in this example. The second free layer 824'(2) has a second aspect ratio 844(2) with the easy axis of the second free layer 824'(2) elongated in the Y-axis direction over the X-axis direction. For example, the second aspect ratio 844(2) may be between approximately 1.5 and 2.5 in this example. The third free layer 824'(3) has a third aspect ratio 844(3) with the easy axis of the third free layer 824'(3) elongated in the Y-axis direction over the X-axis direction. For example, the third aspect ratio 844(3) may be between approximately 2.5 and 3.5 in this example. The fourth free layer 824'(4) has a fourth aspect ratio 844(4) with the easy axis of the fourth free layer 824'(4) elongated in the Y-axis direction over the X-axis direction. For example, the fourth aspect ratio 844(4) may be between approximately 4.5 and 5.5 in this example.

The TMR devices 802(1)-802(4) in FIG. 11 are each configured to exhibit changes in their resistances, in response to the magnetic stray field 826 applied to their free layers 824'(1)-824'(4) as a function of their respective magnetization angles $\Theta_1'$-$\Theta_4'$ between their respective free layers 824'(1)-824'(4) and their pinned layers 818'(1)-818'(4) and the aspect ratios 844(1)-844(4) of their respective free layers 824'(1)-824'(4). In this example, because the aspect ratios 844(1)-844(4) of the free layers 824'(1)-824'(4) of the TMR devices 802(1)-802(4) are different, their magnetic sensitivities will be different and thus their change in resistances in response to the magnetic stray field 826 applied to their free layers 824'(1)-824'(4) will be at different change rates. This facilitates providing different detection sensitivities in the TMR sensor 800 for different sizes and/or volumes of magnetic nanoparticles 806. The different magnetic sensitivities of the TMR devices 802(1)-802(4) can compensate for process variations that affect the magnetic properties of the TMR devices 802(1)-802(4) during fabrication, such as their MR ratio, magnetic anistropy, and/or coercivity, which could otherwise reduce the detection sensitivity of the TMR sensor 800. For example, the aspect ratios 844(1)-844(4) may be different by more than at least approximately 0.5 between at least two TMR devices 802(1)-802(4) in the TMR sensor 800 in FIG. 11.

Note that the examples of the TMR sensor 800 in FIGS. 10 and 11 could be combined to provide TMR devices that have two or more free layers varying in magnetization angles and the same or different two or more free layers with varying aspect ratios, to vary the magnetic sensitivity of the TMR devices in the TMR sensor 800.

Figure 12:
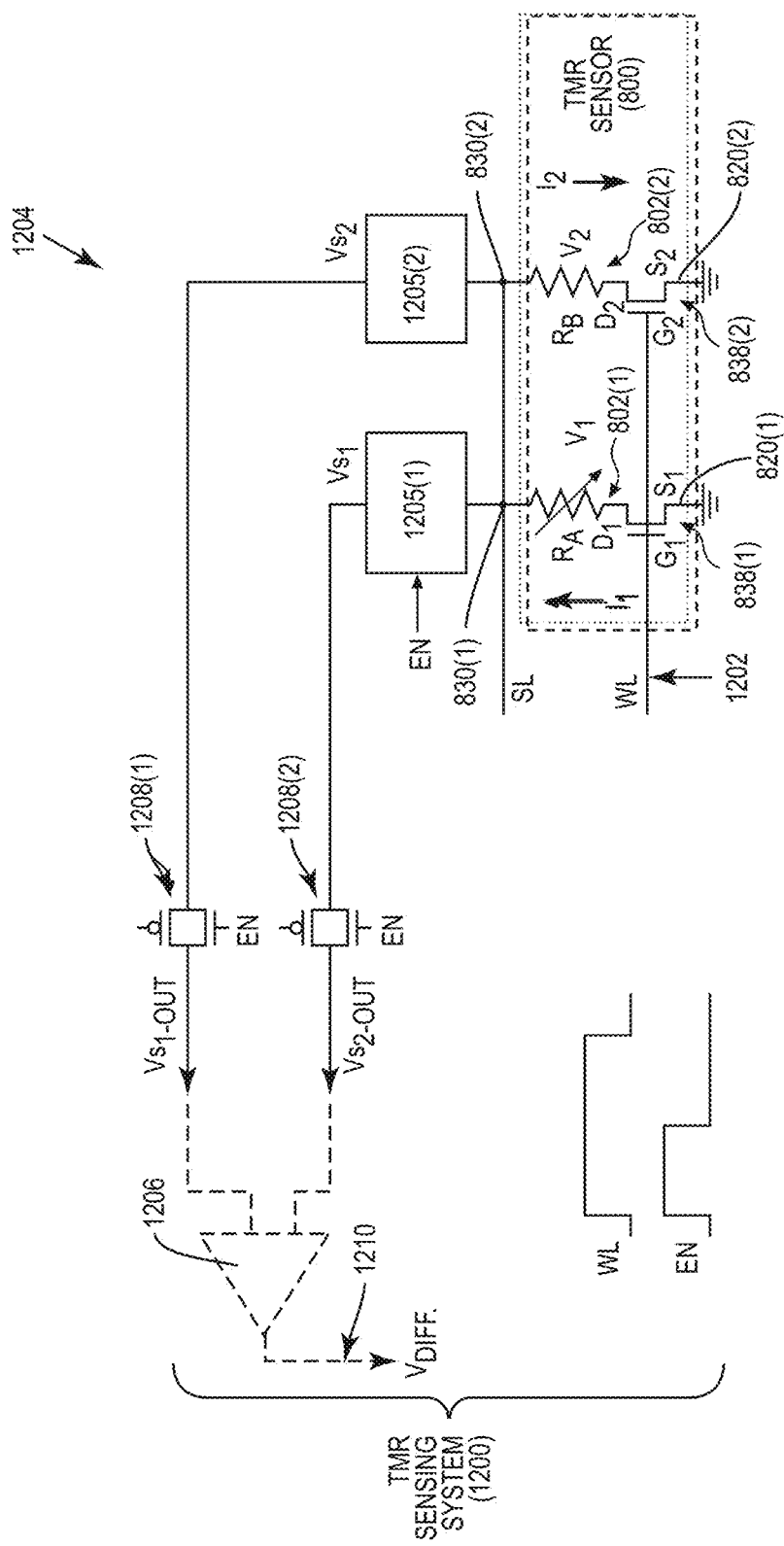
FIG. 12 is a schematic diagram of the TMR sensor employing the TMR devices in FIG. 8 and a TMR sensing system employing sensing circuitry configured to sense a change in resistance in the TMR devices based on the presence of a magnetic stray field applied to an external channel of the TMR sensor.

FIG. 12 is a schematic diagram of an exemplary TMR sensing system 1200 that can employ the TMR sensor 800 in FIGS. 8-11 to generate signals representing the detection of magnetic nanoparticles 806 based on the differential change in resistances of the TMR sensor 800. For example, the first and second TMR devices 802(1), 802(2) of the TMR sensor 800 in FIG. 8 having different magnetic sensitivities are represented in circuit form as resistances $R_A$, $R_B$. First and second access transistors 838(1), 838(2) are shown provided in the TMR sensor 800 to provide a current path through the TMR devices 802(1), 802(2). As previously discussed in FIG. 8, the first and second access transistors 838(1), 838(2) include gates $G_1$, $G_2$, sources $S_1$, $S_2$, and drains $D_1$, $D_2$. The gates $G_1$, $G_2$, are coupled to a common word line (WL) in this example. The first and second top electrodes 830(1), 830(2) of the first and second TMR devices 802(1), 802(2) are coupled to a common source line (SL). The first and second TMR devices 802(1), 802(2) are each configured to receive first and second currents $I_1$, $I_2$ between their first and second top electrodes 830(1), 830(2) and their respective first and second bottom electrode 820(1), 820(2) based on the first and second resistances $R_A$, $R_A$ of the first and second TMR devices 802(1), 802(2), in response to a control signal 1202 on the word line (WL) activating the first and second access transistors 838(1), 838(2) and a voltage $V_1$, $V_2$ applied to the source line (SL).

With continuing reference to FIG. 12, a sensing circuit 1204 that includes circuits 1205(1), 1205(2) is provided in the TMR sensing system 1200. The circuits 1205(1), 1205(2) are configured to receive the respective first and second currents $I_1$, $I_2$ from the first and second TMR devices 802(1), 802(2) of the TMR sensor 800 in response to an enable signal EN indicating an enable state (high state in this example). In response to the enable signal EN indicating the enable state, the circuit 1205(1) is configured to receive the first current L from the first TMR device 802(1), and the circuit 1205(2) is configured to receive the second current $I_2$ from the second TMR device 802(2). The circuits 1205(1), 1205(2) are configured to generate a respective first sensed voltage $Vs_1$ and a second sensed voltage $Vs_2$ indicative of the sensed first and second currents $I_1$, $I_2$ representing the first and second resistances $R_A$, $R_B$ of the first and second TMR devices 802(1), 802(2). For example, if a differential sensing scheme is employed, the sensing circuit 1204 may be a combined differential sensing circuit, such as a current-latched sense amplifier (CLSA) for example. For example, a differential sensing circuit that may be employed for the sensing circuit 1204 may be the N-type (N) MOS offset-cancelling (OC) current-latched (CL) sense amplifier (SA) (NOC-CLSA) as described in Kim et al., "*A 45 nm 1 Mb Embedded STT-MRAM with design techniques to minimize read-disturbance*," which is incorporated by reference herein in its entirety.

With continuing reference to FIG. 12, an optional sense amplifier 1206 is also provided in the sensing circuit 1204 in the TMR sensing system 1200 if differential sensing is employed in the TMR sensing system 1200. The sense amplifier 1206 is configured to receive the first and second sensed voltages $Vs_1$ and $Vs_2$ from the circuits 1205(1), 1205(2). In this example, a first input circuit 1208(1) and a second input circuit 1208(2) provided in the form of pass gates control the timing of the sense amplifier 1206 receiving the first and second sensed voltages $Vs_1$ and $Vs_2$ from the sensing circuit 1204 based on the enable signal EN. The first input circuit 1208(1) is configured to pass the first sensed voltage $Vs_1$, and the second input circuit 1208(2) is configured to pass the second sensed voltage $Vs_2$ during a second sensing phase. The sense amplifier 1206 is configured to sense the first sensed voltage $Vs_1$ and the second sensed voltage $Vs_2$ based on the differential voltage therebetween to generate an amplified differential output voltage Vout on an output node 1210 indicative of the resistance state of the TMR devices 802(1), 802(2). If a differential sensing scheme is not employed, the first sensed voltage $Vs_1$ and the second sensed voltage $Vs_2$ can be analyzed separately to determine the change in resistances $R_A$, $R_B$ of the first and second TMR devices 802(1), 802(2).

Figure 13:
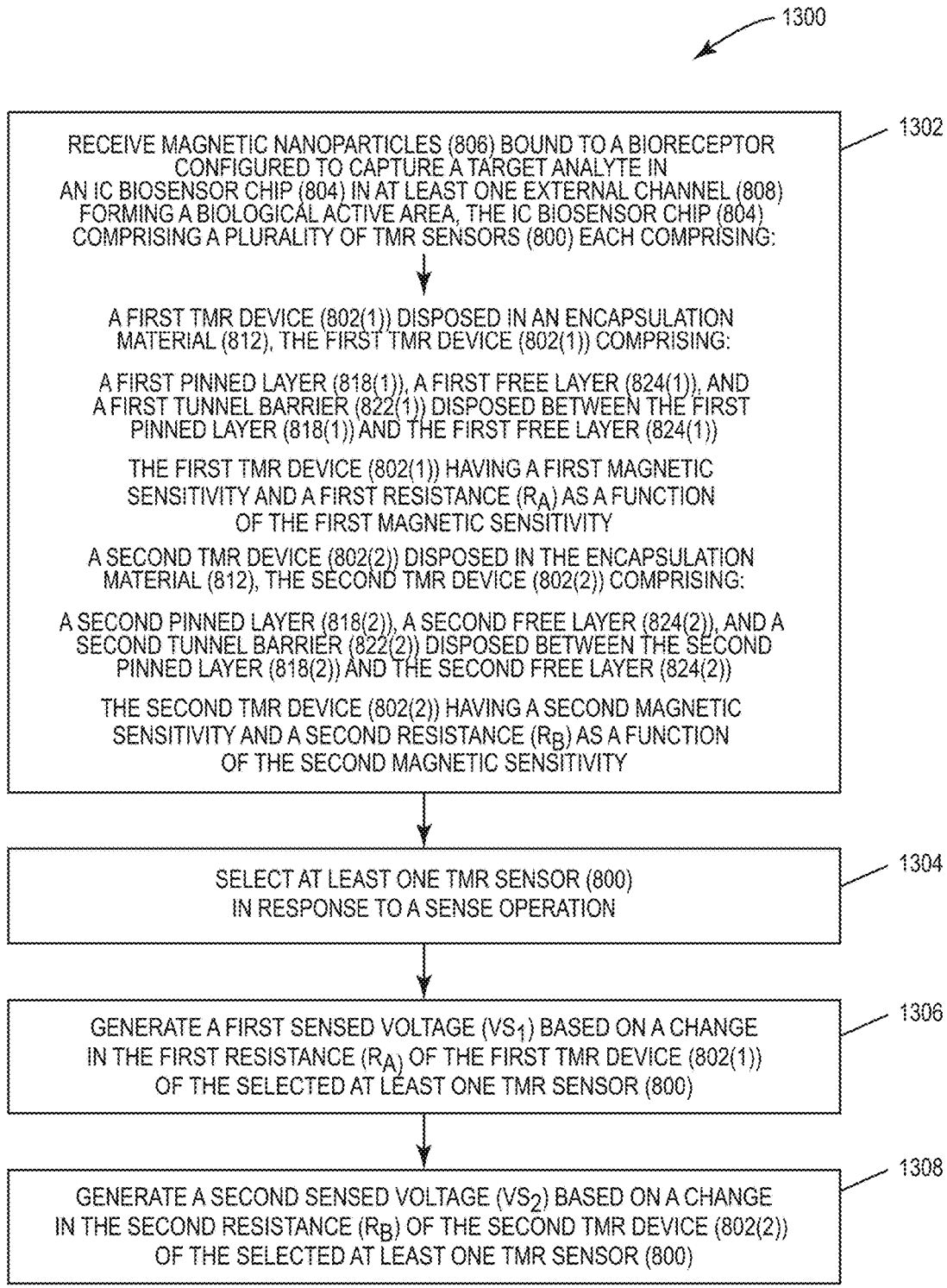
FIG. 13 is a flowchart illustrating an exemplary process of the TMR sensing system in the TMR sensor in FIG. 12 measuring the presence of magnetic nanoparticles passing through the external channel of the TMR sensor.

FIG. 13 is a flowchart illustrating an exemplary process 1300 of the TMR sensing system 1200 in the TMR sensor 800 in FIG. 12 measuring the presence of magnetic nanoparticles 806 passing through the external channel 808 of the TMR sensor 800. In this regard, the TMR sensor 800 receives magnetic nanoparticles 806 bound to a bioreceptor configured to capture a target analyte of interest in a biosensor chip 804 in at least one external channel 808 forming a biological active area, the IC biosensor chip 804 comprising a plurality of TMR sensors 800 (block 1302). As previously discussed with regard to FIG. 8, the TMR sensor 800 includes a first TMR device 802(1) disposed in an encapsulation material 812. The first TMR device 802(1) comprises a first pinned layer 818(1), a first free layer 824(1), and a first tunnel barrier 822(1) disposed between the first pinned layer 818(1) and the first free layer 824(1). The first TMR device 802(1) has a first magnetic sensitivity and a first resistance $R_A$ as a function of the first magnetic sensitivity. The TMR sensor 800 also includes a second TMR device 802(2) disposed in the encapsulation material 812. The second TMR device 802(2) comprises a second pinned layer 818(2), a second free layer 824(2), and a second tunnel barrier 822(2) disposed between the second pinned layer 818(2) and the second free layer 824(2). The second TMR device 802(2) has a second magnetic sensitivity and a second resistance $R_B$ as a function of the second magnetic sensitivity. The sensing circuit 1204 is configured to select at least one TMR sensor 800 in response to a sense operation (block 1304). The sensing circuit 1204 is also configured to generate a first sensed voltage $Vs_1$ based on a change in the first resistance $R_A$ of the first TMR device 802(1) of the selected at least one TMR sensor 800 (block 1306). The sensing circuit 1204 is also configured to generate a second sensed voltage $Vs_2$ based on a change in the second resistance $R_B$ of the second TMR device 802(1) of the selected at least one TMR sensor 800 (block 1308).

Figure 14:
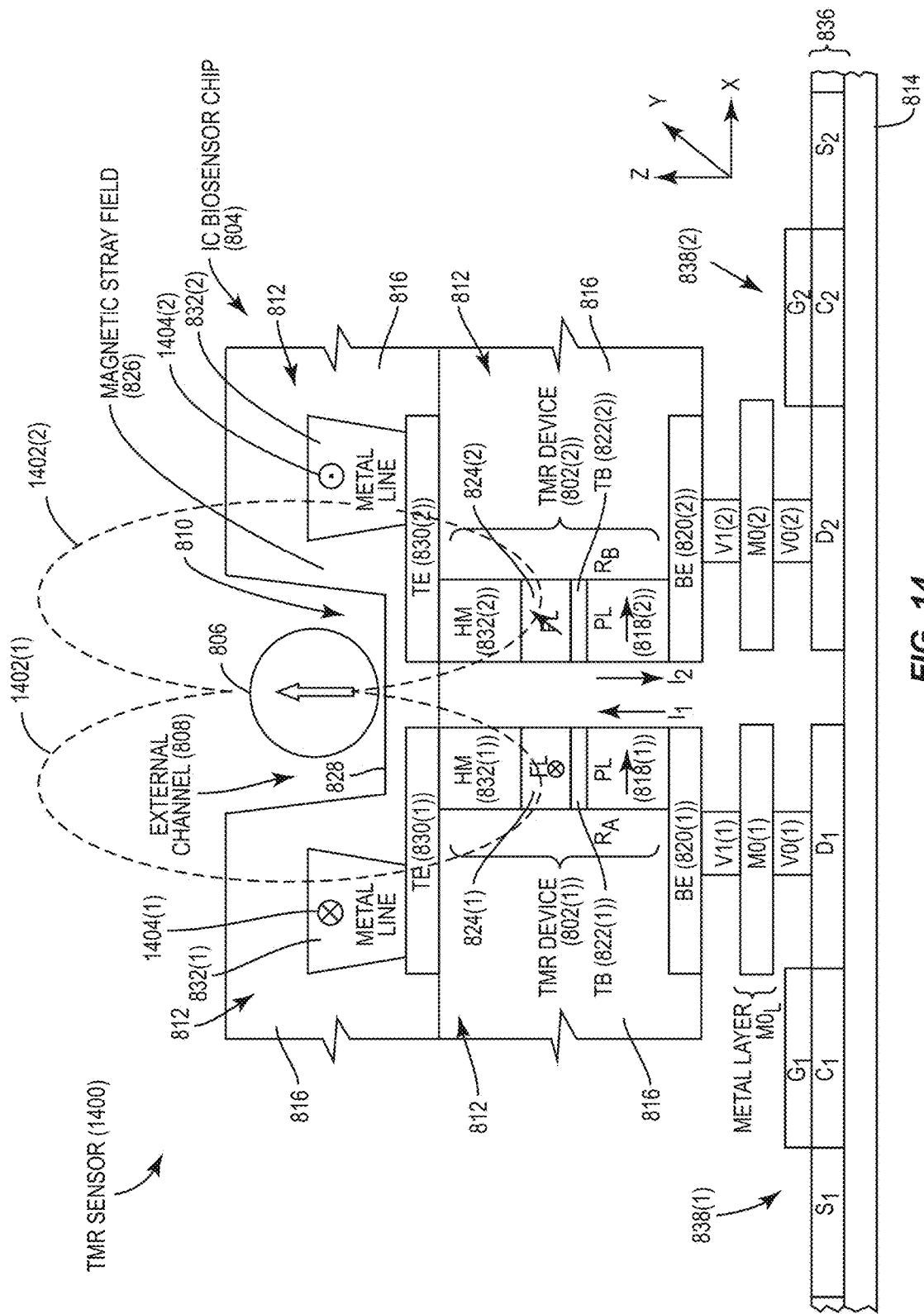
FIG. 14 is a side view of another exemplary TMR sensor that includes multiple TMR devices, wherein at least two TMR devices have different magnetic sensitivities to increase magnetic field detection sensitivity, and wherein metal lines coupled to the TMR devices are configured to generate a magnetic bias field in response to a current flow therein to align the magnetic moments of magnetic nanoparticles passing through the external channel of the TMR sensor.

As previously discussed, it may be desired to apply an external magnetic bias field to the magnetic nanoparticles 806 to be detected in the TMR sensor 800 in FIG. 8, to align their magnetic moments. It may be desired to avoid the need to provide an external source for generation of an external magnetic field for the TMR sensor 800 in FIG. 8. In this regard, FIG. 14 illustrates an alternative TMR sensor 1400 that is similar to the TMR sensor 800 in FIG. 8. Common elements between the TMR sensor 1400 in FIG. 14 and the TMR sensor 800 in FIG. 8 are shown with common element numbers. In the TMR sensor 1400 in FIG. 8, the metal lines 832(1), 832(2) are employed to generate magnetic bias fields 1402(1), 1402(2) in the external channel 808 to align the magnetic moments of the magnetic nanoparticles 806. For example, the metal lines 832(1), 832(2) may be Copper (Cu). In this regard, a current 1404(1) is generated in the TMR sensor 800 and applied into the plane in the Y-axis direction to the metal line 832(1) to generate the magnetic bias field 1402(1). A current 1404(2) is generated in the TMR sensor 800 and applied into the plane in the Y-axis direction to the metal line 832(2) to generate the magnetic bias field 1402(2). The magnetic bias fields 1402(1), 1402(2) for a magnetic loop that can align the magnetic moments of the magnetic nanoparticles 806 so that the generate a uniform magnetic stray field 826 in the external channel 808, are also applied to the free layers 824(1), 824(2). In this manner, an external magnetic field generator, such as a coil for example, is not required to be provided to generate a magnetic bias field in the external channel 808 to align the magnetic moment of magnetic nanoparticles 806 disposed in the external channel 808.

Figure 15:
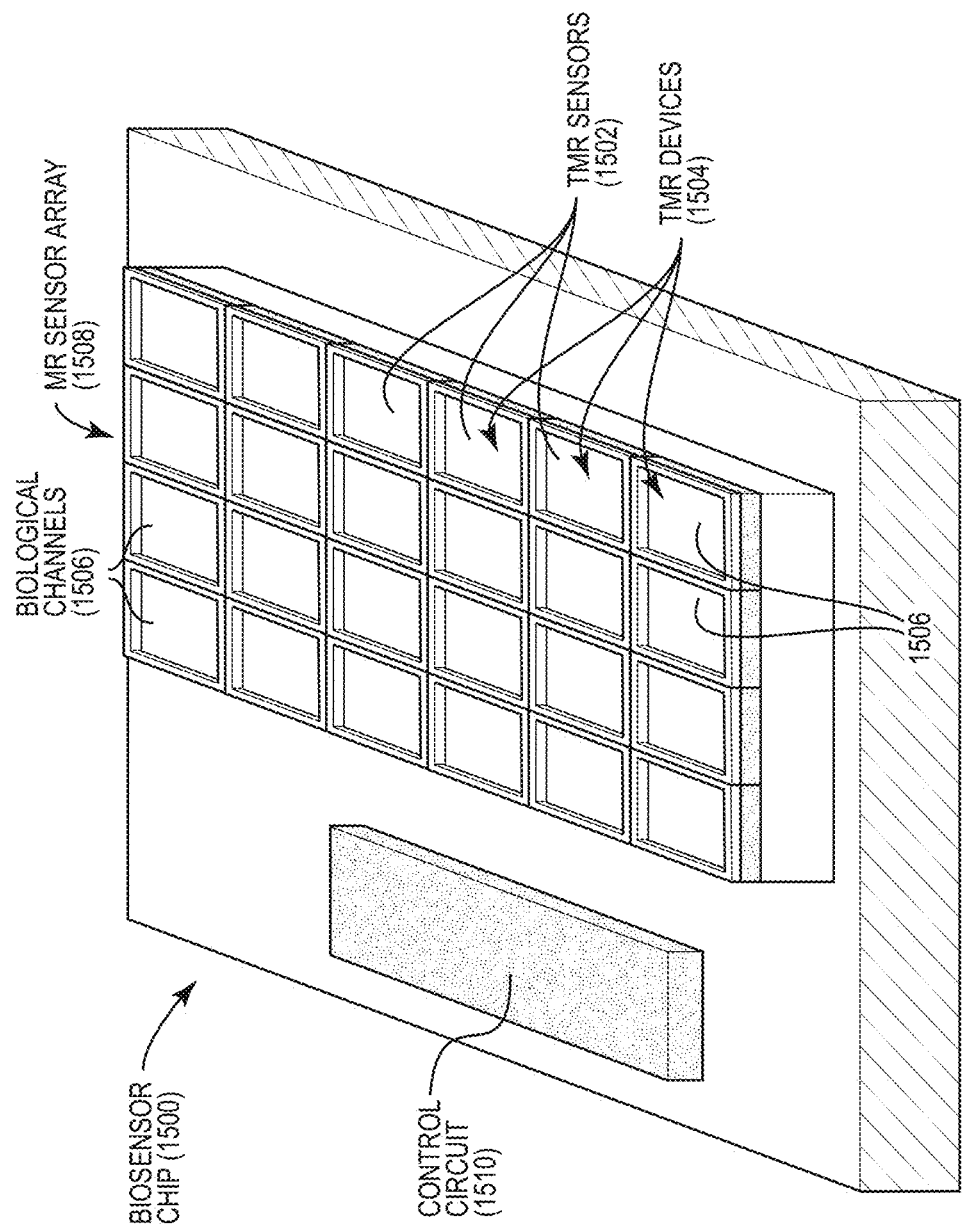
FIG. 15 is an exemplary biosensor chip that can employ one or more TMR sensors each employing at least two TMR devices having different magnetic field sensitivities to increase magnetic field detection sensitivity, including but not limited to the TMR sensors in FIGS. 8-11, 13, and 14.

FIG. 15 is an exemplary biosensor chip 1500 that can employ one or more TMR sensors 1502, including but not limited to the TMR sensors 800, 1400 in FIGS. 8-11, 12, and 14 as examples, each having different magnetic field sensitivities for increased detection sensitivity. The biosensor chip 1500 may be provided in different applications, including wearable devices, point-of-care devices for point-of-care applications, a bacteria inflection diagnostics device for bacteria infection detection applications, a cancer detection device for cancer detection, a heart disease diagnostic device for detecting heart disease, a food safety monitoring device for food monitoring applications, etc. The magnetic nanoparticles may be bound to a bioreceptor that is bound to a target analyte of interest, in a channel disposed between TMR devices 1504, based on an MR effect. As shown in FIG. 15, the biosensor chip 1500 may have a plurality of biological channels 1506 as part of an MR sensor array 1508 that contains a plurality of TMR sensors 1502. The biological channels 1506 are configured to receive biological material such as magnetic nanoparticles bound to a bioreceptor capturing an analyte of interest. A control circuit 1510 may also be provided in the biosensor chip 1500 that controls the sensing operation of the biosensor chip 1500. For example, the control circuit 1510 may include components in the TMR sensing system 1200 in FIG. 12, including the sensing circuit 1204 and the sense amplifier 1206.

In another example, a TMR sensor can be provided that includes a first means disposed in an encapsulation material and having a first magnetic sensitivity for providing a first resistance as a function of the first magnetic sensitivity, and for exhibiting a first change rate in the first resistance in response to a magnetic stray field as a function of the first magnetic sensitivity. The first means may be the first TMR device 802(1) in FIGS. 8-12 and 14 as examples. The TMR sensor includes a second means disposed in the encapsulation material and having a second magnetic sensitivity for providing a second resistance as a function of the second magnetic sensitivity, and for exhibiting a second change rate in the second resistance in response to the magnetic stray field as a function of the second magnetic sensitivity. The second means may be the second TMR device 802(2) in FIGS. 8-12 and 14 as examples. The TMR sensor may also include a means, such as the external channel 808 shown in FIGS. 8-11 and 14, formed in a void in the encapsulation material for capturing external magnetic nanoparticles exerting the magnetic stray field on the first means and the second means.

Those of skill in the art will further appreciate that the various illustrative logical blocks, modules, circuits, and algorithms described in connection with the aspects disclosed herein may be implemented as electronic hardware, instructions stored in memory or in another computer-readable medium and executed by a processor or other processing device, or combinations of both. The master devices and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flow chart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:
1. A tunnel magneto-resistive (TMR) sensor, comprising:
a first TMR device comprising:
a first pinned layer, a first free layer, and a first tunnel barrier disposed between the first pinned layer and the first free layer;

the first TMR device having a first magnetic sensitivity and a first resistance as a function of the first magnetic sensitivity;
a second TMR device comprising:
a second pinned layer, a second free layer, and a second tunnel barrier disposed between the second pinned layer and the second free layer;
the second TMR device having a second magnetic sensitivity different from the first magnetic sensitivity of the first TMR device, and having a second resistance as a function of the second magnetic sensitivity;
a first bottom electrode electrically coupled to the first pinned layer of the first TMR device;
a first top electrode electrically coupled to the first free layer of the first TMR device;
a second bottom electrode electrically coupled to the second pinned layer of the second TMR device; and
a second top electrode electrically coupled to the second free layer of the second TMR device;
the first TMR device configured to carry a first current between the first bottom electrode and the first top electrode in response to a first voltage differential applied between the first bottom electrode and the first top electrode based on the first resistance of the first TMR device; and
the second TMR device configured to carry a second current between the second bottom electrode and the second top electrode in response to a second voltage differential applied between the second bottom electrode and the second top electrode based on the second resistance of the second TMR device; and
a first access transistor comprising a first gate, a first electrode, and a second electrode, wherein:
the first gate of the first access transistor is electrically coupled to a word line;
the first bottom electrode of the first TMR device is electrically coupled to the first electrode of the first access transistor; and
the first top electrode of the first TMR device is electrically coupled to a source line;
the first TMR device configured to receive the first current between the first top electrode and the first bottom electrode based on the first resistance of the first TMR device, in response to a control signal on the word line activating the first access transistor and a first voltage applied to the source line; and
a second access transistor comprising a second gate, a first electrode, and a second electrode, wherein:
the second gate of the second access transistor is electrically coupled to the word line;
the second bottom electrode of the second TMR device is electrically coupled to the first electrode of the second access transistor; and
the second top electrode of the second TMR device is electrically coupled to the source line;
the second TMR device configured to receive the second current between the second top electrode and the second bottom electrode based on the second resistance of the second TMR device in response to the control signal on the word line activating the second access transistor and a second voltage applied to the source line.

2. The TMR sensor of claim 1, wherein:
the first TMR device is encapsulated in an encapsulation material;

the second TMR device is encapsulated in the encapsulation material; and
further comprising an external channel formed in a void in the encapsulation material adjacent to the first TMR device and the second TMR device, the external channel configured to capture magnetic nanoparticles to exert a magnetic stray field on the first free layer and the second free layer.

3. The TMR sensor of claim 1, wherein:
the first TMR device is configured to exhibit a first change rate in the first resistance, in response to a magnetic stray field applied to the first free layer as a function of the first magnetic sensitivity; and
the second TMR device is configured to exhibit a second change rate in the second resistance different from the first change rate in the first resistance of the first TMR device, in response to the magnetic stray field applied to the second free layer.

4. The TMR sensor of claim 1, wherein:
the first pinned layer has a first pinned magnetization;
the first free layer has a first free layer magnetization at a first magnetization angle to the first pinned magnetization of the first pinned layer, wherein the first resistance of the first TMR device is a function of the first magnetization angle;
the second pinned layer has a second pinned magnetization; and
the second free layer has a second free layer magnetization at a second magnetization angle to the second pinned magnetization of the second pinned layer, the second magnetization angle different from the first magnetization angle, wherein the second resistance of the second TMR device is a function of the second magnetization angle.

5. The TMR sensor of claim 4, wherein:
the first TMR device is configured to exhibit a first change rate in the first resistance, in response to a magnetic stray field applied to the first free layer as a function of the first magnetization angle; and
the second TMR device is configured to exhibit a second change rate in the second resistance different from the first change rate in the first resistance of the first TMR device, in response to the magnetic stray field applied to the second free layer as a function of the second magnetization angle.

6. The TMR sensor of claim 4, wherein the first magnetization angle and the second magnetization angle are different by more than at least approximately ten (10) degrees.

7. The TMR sensor of claim 4, wherein:
the first free layer magnetization is at least ninety (90) degrees from the first pinned magnetization; and
the second free layer magnetization is between at least sixty (60) and eighty (80) degrees from the second pinned magnetization.

8. The TMR sensor of claim 4, wherein the first free layer magnetization is substantially out-of-plane to the first pinned magnetization, and the second free layer magnetization is substantially out-of-plane to the second pinned magnetization.

9. The TMR sensor of claim 1, wherein:
the first free layer has a first aspect ratio, wherein the first resistance of the first TMR device is a function of the first aspect ratio; and
the second free layer has a second aspect ratio different from the first aspect ratio of the first free layer, wherein the second resistance of the second TMR device is a function of the second aspect ratio.

10. The TMR sensor of claim 9, wherein:
the first aspect ratio is between approximately 3.5 and 5.5; and
the second aspect ratio is between approximately 1.5 and 3.5.

11. The TMR sensor of claim 9, wherein:
the first TMR device is configured to exhibit a first change rate in the first resistance in response to a magnetic stray field applied to the first free layer as a function of the first aspect ratio of the first free layer; and
the second TMR device is configured to exhibit a second change rate in the second resistance different from the first change rate in the first resistance of the first TMR device, in response to the magnetic stray field applied to the second free layer as a function of the second aspect ratio of the second free layer.

12. The TMR sensor of claim 9, wherein:
the first pinned layer has a first pinned magnetization;
the first free layer has a first free layer magnetization at a first magnetization angle to the first pinned magnetization of the first pinned layer, wherein the first resistance of the first TMR device is a further function of the first magnetization angle;
the second pinned layer has a second pinned magnetization; and
the second free layer has a second free layer magnetization at a second magnetization angle to the second pinned magnetization of the second pinned layer, the second magnetization angle different from the first magnetization angle, wherein the second resistance of the second TMR device is a further function of the second magnetization angle.

13. The TMR sensor of claim 1, further comprising:
a third TMR device disposed in an encapsulation material and having a third resistance, the third TMR device comprising:
a third pinned layer, a third free layer, and a third tunnel barrier disposed between the third pinned layer and the third free layer;
the third TMR device having a third magnetic sensitivity.

14. The TMR sensor of claim 13, wherein the third magnetic sensitivity is different from at least one of the first magnetic sensitivity and the second magnetic sensitivity.

15. The TMR sensor of claim 13, further comprising:
a fourth TMR device disposed in the encapsulation material and having a fourth resistance, the fourth TMR device comprising:
a fourth pinned layer, a fourth free layer, and a fourth tunnel barrier disposed between the fourth pinned layer and the fourth free layer;
the fourth TMR device having a fourth magnetic sensitivity different from the first magnetic sensitivity of the first TMR device and the second magnetic sensitivity of the second TMR device, the fourth TMR device configured to exhibit a fourth change rate in a fourth resistance, in response to a magnetic stray field applied to the fourth free layer.

16. The TMR sensor of claim 15, wherein:
the first TMR device and the second TMR device are aligned along a first axis;
the third TMR device and the fourth TMR device are aligned along a second axis substantially parallel to the first axis;
the first TMR device and the third TMR device are aligned along a third axis substantially orthogonal to the first axis; and
the second TMR device and the fourth TMR device are aligned along a fourth axis substantially orthogonal to the first axis and substantially parallel to the third axis.

17. The TMR sensor of claim 1, wherein a bottom surface of an external channel is disposed in a horizontal plane adjacent to the first TMR device and the second TMR device.

18. The TMR sensor of claim 1, further comprising:
a first metal line electrically coupled to the first top electrode;
a second metal line electrically coupled to the second top electrode;
the first metal line configured to carry a first current out-of-plane to the first TMR device in a first direction and the second metal line configured to carry a second current out-of-plane to the second TMR device in a second direction opposite of the first direction, to generate a magnetic bias field in an external channel.

19. The TMR sensor of claim 1, comprising an MR biosensor configured to capture magnetic nanoparticles bound to a bioreceptor bound to a target analyte of a biological sample.

20. The TMR sensor of claim 1 integrated into an integrated circuit (IC) chip.

21. The TMR sensor of claim 1 integrated into a device selected from the group consisting of: a wearable device, a point-of-care device, a bacteria infection diagnostic device, a cancer detection device, a heart disease diagnostic device, and a food safety monitoring device.

22. A tunnel magneto-resistive (TMR) sensing system, comprising:
one or more TMR sensors each comprising:
a first TMR device disposed in an encapsulation material, the first TMR device comprising:
a first pinned layer, a first free layer, and a first tunnel barrier disposed between the first pinned layer and the first free layer;
the first TMR device having a first magnetic sensitivity and a first resistance as a function of the first magnetic sensitivity;
a second TMR device disposed in the encapsulation material, the second TMR device comprising:
a second pinned layer, a second free layer, and a second tunnel barrier disposed between the second pinned layer and the second free layer;
the second TMR device having a second magnetic sensitivity different from the first magnetic sensitivity of the first TMR device, and having a second resistance as a function of the second magnetic sensitivity;
a first bottom electrode electrically coupled to the first pinned layer of the first TMR device;
a first top electrode electrically coupled to the first free layer of the first TMR device;
a second bottom electrode electrically coupled to the second pinned layer of the second TMR device; and
a second top electrode electrically coupled to the second free layer of the second TMR device;
the first TMR device configured to carry a first current between the first bottom electrode and the first top electrode in response to a first voltage differential applied between the first bottom electrode and the first top electrode based on the first resistance of the first TMR device; and
the second TMR device configured to carry a second current between the second bottom electrode and the second top electrode in response to a second voltage differential applied between the second bottom electrode and the second top electrode based on the second resistance of the second TMR device; and a first access transistor comprising a first gate, a first electrode, and a second electrode, wherein:
the first gate of the first access transistor is electrically coupled to a word line;
the first bottom electrode of the first TMR device is electrically coupled to the first electrode of the first access transistor; and
the first top electrode of the first TMR device is electrically coupled to a source line;
the first TMR device configured to receive the first current between the first top electrode and the first bottom electrode based on the first resistance of the first TMR device, in response to a control signal on the word line activating the first access transistor and a first voltage applied to the source line; and a second access transistor comprising a second gate, a first electrode, and a second electrode, wherein:
the second gate of the second access transistor is electrically coupled to the word line;
the second bottom electrode of the second TMR device is electrically coupled to the first electrode of the second access transistor; and
the second top electrode of the second TMR device is electrically coupled to the source line;
the second TMR device configured to receive the second current between the second top electrode and the second bottom electrode based on the second resistance of the second TMR device in response to the control signal on the word line activating the second access transistor and a second voltage applied to the source line; and a sensing circuit configured to:
select a TMR sensor among the one or more TMR sensors in response to a sense operation;
generate a first sensed voltage based on a change in the first resistance of the first TMR device of the selected TMR sensor; and
generate a second sensed voltage based on a change in the second resistance of the second TMR device of the selected TMR sensor.

23. The TMR sensing system of claim 22, further comprising a sense amplifier configured to generate a differential output voltage based on a difference between the first sensed voltage and the second sensed voltage.

24. The TMR sensing system of claim 22, wherein:
for each of the first TMR devices among the one or more TMR sensors:
the first pinned layer has a first pinned magnetization; and
the first free layer has a first free layer magnetization at a first magnetization angle to the first pinned magnetization of the first pinned layer, wherein the first resistance of the first TMR device is a function of the first magnetization angle; and
for each of the second TMR devices among the one or more TMR sensors:
the second pinned layer has a second pinned magnetization; and
the second free layer has a second free layer magnetization at a second magnetization angle to the second pinned magnetization of the second pinned layer, the second magnetization angle different from the first magnetization angle, wherein the second resistance of the second TMR device is a function of the second magnetization angle.

25. The TMR sensing system of claim 22, wherein:
for each of the first TMR devices among the one or more TMR sensors, the first free layer has a first aspect ratio, wherein the first resistance of the first TMR device is a function of the first aspect ratio; and
for each of the second TMR devices among the one or more TMR sensors, the second free layer has a second aspect ratio different from the first aspect ratio of the first free layer, wherein the second resistance of the second TMR device is a function of the second aspect ratio.

26. A method of detecting a presence of magnetic nanoparticles in a tunnel magneto-resistive (TMR) sensor, comprising:
receiving magnetic nanoparticles bound to a bioreceptor configured to capture a target analyte in a biosensor chip in at least one external channel among a plurality of external channels each forming a biological active area, the biosensor chip comprising a plurality of TMR sensors each comprising:
a first TMR device disposed in an encapsulation material, the first TMR device comprising:
a first pinned layer, a first free layer, and a first tunnel barrier disposed between the first pinned layer and the first free layer;
the first TMR device having a first magnetic sensitivity and a first resistance as a function of the first magnetic sensitivity;
a second TMR device disposed in the encapsulation material, the second TMR device comprising:
a second pinned layer, a second free layer, and a second tunnel barrier disposed between the second pinned layer and the second free layer;
the second TMR device having a second magnetic sensitivity different from the first magnetic sensitivity of the first TMR device, and having a second resistance as a function of the second magnetic sensitivity;
a first bottom electrode electrically coupled to the first pinned layer of the first TMR device;
a first top electrode electrically coupled to the first free layer of the first TMR device;
a second bottom electrode electrically coupled to the second pinned layer of the second TMR device; and
a second top electrode electrically coupled to the second free layer of the second TMR device;
the first TMR device configured to carry a first current between the first bottom electrode and the first top electrode in response to a first voltage differential applied between the first bottom electrode and the first top electrode based on the first resistance of the first TMR device; and
the second TMR device configured to carry a second current between the second bottom electrode and the second top electrode in response to a second voltage differential applied between the second bottom electrode and the second top electrode based on the second resistance of the second TMR device; and
a first access transistor comprising a first gate, a first electrode, and a second electrode, wherein:
the first gate of the first access transistor is electrically coupled to a word line;

the first bottom electrode of the first TMR device is electrically coupled to the first electrode of the first access transistor; and
the first top electrode of the first TMR device is electrically coupled to a source line;
a second access transistor comprising a second gate, a first electrode, and a second electrode, wherein:
the second gate of the second access transistor is electrically coupled to the word line;
the second bottom electrode of the second TMR device is electrically coupled to the first electrode of the second access transistor; and
the second top electrode of the second TMR device is electrically coupled to the source line;
applying a control signal to the word line to activate the first access transistor and the second access transistor;
applying a first voltage to the source line to cause the first access transistor to receive a first current between the first top electrode and the first bottom electrode based on the first resistance of the first TMR device, and the second access transistor to receive a second current between the second top electrode and the second bottom electrode based on the second resistance of the second TMR device;
generating a first sensed voltage based on a change in the first resistance of the first TMR device of the selected at least one TMR sensor; and
generating a second sensed voltage based on a change in the second resistance of the second TMR device of the selected at least one TMR sensor.

27. The method of claim 26, further comprising generating a differential output voltage indicative of a presence of the magnetic nanoparticles in the at least one external channel based on a difference between the first sensed voltage and the second sensed voltage.

28. The method of claim 26, wherein:
the first TMR device is encapsulated in the encapsulation material;
the second TMR device is encapsulated in the encapsulation material; and
the at least one external channel formed in a void in the encapsulation material adjacent to the first TMR device and the second TMR device, the external channel configured to capture magnetic nanoparticles to exert a magnetic stray field on the first free layer and the second free layer.

29. The method of claim 26, wherein:
the first pinned layer has a first pinned magnetization;
the first free layer has a first free layer magnetization at a first magnetization angle to the first pinned magnetization of the first pinned layer, wherein the first resistance of the first TMR device is a function of the first magnetization angle;
the second pinned layer has a second pinned magnetization; and
the second free layer has a second free layer magnetization at a second magnetization angle to the second pinned magnetization of the second pinned layer, the second magnetization angle different from the first magnetization angle, wherein the second resistance of the second TMR device is a function of the second magnetization angle.

30. The method of claim 26, wherein:
the first free layer has a first aspect ratio, wherein the first resistance of the first TMR device is a function of the first aspect ratio; and
the second free layer has a second aspect ratio different from the first aspect ratio of the first free layer, wherein the second resistance of the second TMR device is a function of the second aspect ratio.

\* \* \* \* \*